United States Patent
McGeer et al.

(10) Patent No.: US 6,421,808 B1
(45) Date of Patent: Jul. 16, 2002

(54) HARDWARE DESIGN LANGUAGE FOR THE DESIGN OF INTEGRATED CIRCUITS

(75) Inventors: Patrick C. McGeer, Orinda; Szu-Tsung Cheng, El Cerrito; Michael J. Meyer, Palo alto; Patrick Scaglia, Saratoga, all of CA (US)

(73) Assignee: Cadance Design Systems, Inc., San Jose, CA (US)

( * ) Notice: Subject to any disclaimer, the term of this patent is extended or adjusted under 35 U.S.C. 154(b) by 0 days.

(21) Appl. No.: 09/296,892

(22) Filed: Apr. 22, 1999

Related U.S. Application Data

(60) Provisional application No. 60/082,996, filed on Apr. 24, 1998.

(51) Int. Cl.$^7$ ............................................. G06F 17/50
(52) U.S. Cl. ............................................. 716/1; 703/14
(58) Field of Search ........................ 716/1–21; 703/14

(56) References Cited

U.S. PATENT DOCUMENTS

| | | | |
|---|---|---|---|
| 4,985,831 A | * 1/1991 | Dulong et al. | 709/106 |
| 5,748,488 A | 5/1998 | Gregory et al. | |
| 5,752,002 A | * 5/1998 | Naidu et al. | 703/14 |
| 5,764,915 A | * 6/1998 | Heimsoth et al. | 709/227 |
| 5,809,235 A | * 9/1998 | Sharma et al. | 709/230 |
| 5,870,585 A | * 2/1999 | Stapleton | 395/500 |
| 6,023,568 A | 2/2000 | Segal | |
| 6,053,947 A | * 4/2000 | Parson | 703/14 |
| 6,070,006 A | * 5/2000 | Iriuchijima et al. | 395/701 |
| 6,077,305 A | * 6/2000 | Cheng et al. | 703/16 |
| 6,167,363 A | * 12/2000 | Stapleton | 703/14 |
| 6,279,084 B1 | * 8/2001 | VanDoren et al. | 711/141 |

OTHER PUBLICATIONS

Sanderson et al., Object–oriented Modeling using C++, Proceedings of the 21st Annual Symposium on Simulation, pp. 143–156.*
David Harel, "STATECHARTS: A VISUAL FORMALISM FOR COMPLEX SYSTEMS*", Science of Computer Programming 8, 1997.
Ivan E. Sutherland, "MICROPIPELINES", Communications of the ACM, Jun. 1989.
Alain J. Martin, "The Limitations to Delay–Insensitivity in Asynchronous Circuits", Advanced Research in VLSI Proceedings of the Sixth MIT Conference, 1990.
Charles L. Seitz, "Let's Route Packets Instead of Wires", Advanced Research in VLSI Proceedings of the Sixth MIT Conference, 1990.

(List continued on next page.)

Primary Examiner—Matthew Smith
Assistant Examiner—A. M. Thompson
(74) Attorney, Agent, or Firm—Townsend and Townsend and Crew LLP; Steven J. Cahill

(57) ABSTRACT

A hardware design language V++ is described. V++ provides an automatically designed and implemented communications protocol, embedded by a compiler in the design itself. This protocol permits transparent, automatic communication between modules in a hardware design. The protocol generalizes current design practice and impacts neither the cycle time, nor the area, of a typical system. Incorporating this protocol in the language itself frees the designer from the task of writing communications code, and ensures that two communicating modules follow the same low-level protocol. In V++ each program is directly interpreted as a network of communicating finite state machines. The composition of two V++ programs is a V++ program, with well-defined, deterministic semantics.

26 Claims, 19 Drawing Sheets

(a)

(b)

OTHER PUBLICATIONS

Donald E. Thomas et al., "THE VERILOG HARDWARE DESCRIPTION LANGUAGE", 1991.

Joseph Buck et al., "Ptolemy: A Framework for Simulating and Prototyping Heterogeneous Systems", University of California, Aug. 31, 1992.

Ellen M. Sentovich et al., "Sequential Circuit Design Using Synthesis and Optimization", IEEE, 1992.

Kenneth L. McMillan, "SYMBOLIC MODEL CHECKING", 1993.

Nicolas Halbwachs, "SYNCHRONOUS PROGRAMMING OF REACTIVE SYSTEMS", Chapter 1; Part I, Chapter 2; Chapter 4; Part II, Chapter 5; Chapter 6; Chapter 8, 1993.

Sharad Malik, "Analysis of Cyclic Combinational Circuits", 1993 IEEE/ACM International Conference on Computer–Aided Design, Nov. 7–11, 1993.

Szu–Tsung Cheng, "Compiling Verilog into Automata", Apr. 13, 1994.

A. Aziz et al., "HSIS: A BDD–Based Environment for Formal Verification", 31st DESIGN AUTOMATION CONFERENCE, Jun. 6–10, 1994.

Massimiliano Chiodo et al., "Hardware–Software Codesign of Embedded Systems", IEEE Micro, 1994.

Szu–Tsung Cheng et al., "Compiling Verilog into Timed Finite State Machines", 4th International Verilog HDL Conference, Mar. 27–29, 1995.

Patrick C. McGeer et al., "Fast Discrete Function Evaluation using Decision Diagrams", 1995 IEEE/ACM International Conference on Computer–Aided Design, Nov. 5–9, 1995.

Thomas R. Shiple et al., "Constructive Analysis of Cyclic Circuits", IEEE, 1996.

Wendell Craig Baker, "Interfacing System Description Languages to Formal Verification", 1996.

James A. Rowson et al., "Interface–Based Design", PROCEEDINGS 1997 DESIGN AUTOMATION CONFERENCE, Jun. 9–13, 1997.

Szu–Tsung Cheng, "Compilation, Synthesis, Simulation of Hardware Description Languages–The Compositional Models of HDL's", 1998.

* cited by examiner

|  | Operation | | | | | |
| --- | --- | --- | --- | --- | --- | --- |
|  | (1) | (2) | (3) | (4) | (5) | (6) |
| private in child | ✓ | ✓ | x | x | ✓ | x |
| public in child | ✓ | ✓ | ✓ | x | ✓ | ✓ |
| private in parent | x | x | ✓ | ✓ | x | ✓ |
| public in parent | x | x | ✓ | ✓ | x | ✓ |
| port argument [1] | x | x | x | x | n. a.[2] | n. a.[2] |
FIG. 1
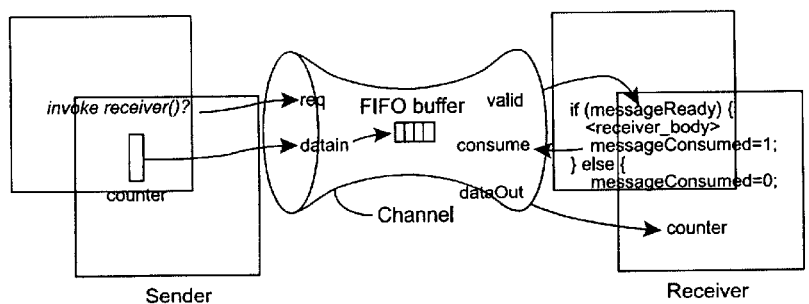
FIG. 2
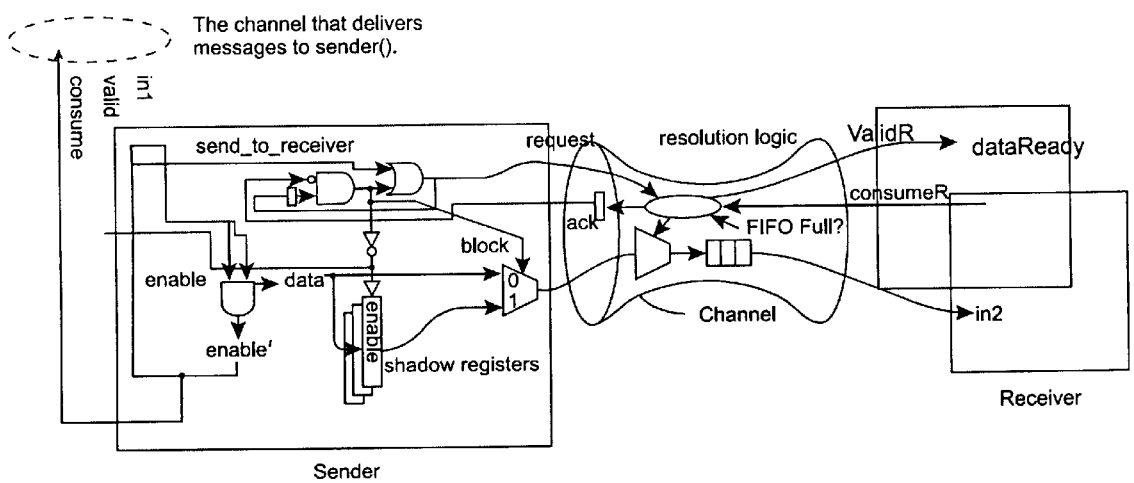
FIG. 3

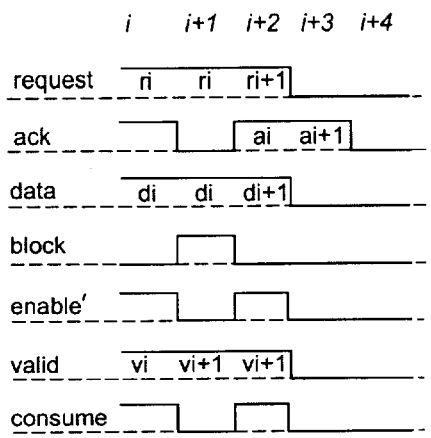

FIG. 4

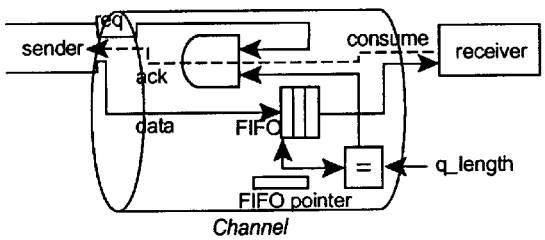

Channel

FIG. 5

| syntax | meaning |
|---|---|
| Behavior modifying attributes: | |
| depth(<number>) | The channel that delivers messages for the port will have an FIFO buffer with capacity <number>. |
| destructive | When the input buffer is full, new incoming message will destroy the last buffer entry. |
| Status checking attributes: | |
| running | This indicates whether the process is running and not blocked (due to suspended safe port invocation). |
| Variable characteristic: | |
| left/right | They apply to array variables and are used to determine the bounds of array variables |

FIG. 6

| Construct | Synopsis |
|---|---|
| Control Flow Constructs ||
| @(<expr>) | wait for <expr> to turn true |
| <label>: | put a symbolic label for branch |
| branch(<cond_expr>) <label> | conditionally transfer control to <label>, depending on the outcome of <cond_expr> |
| { <stmt1> ; ... ; <stmtn> } | serial composition |
| fork<br>   <stmt1> \|\| ... \|\| <stmtn><br>join (<preempt_expr>) | parallel composition with weak preemption - (1) Create concurrent execution threads. (2) Control is transferred to the statement following the fork/join statement when preempt_expr is asserted. Execution of branches of fork/join is untouched when preempt_expr is asserted. |
| Data Flow Constructs ||
| <lhs> = <rhs> | assignment |
| <id> ( <expr_list> ) | default port invocation, unsafe |
| safe <id> ( <expr_list> ) | safe port invocation |

FIG. 10

```
1    @(go) :
2    {
3        foo = a + 1 ;
4        branch(cond) lab;
5        fork
6            @(stop) ; p(a)
7            ||
8            bar + a - 1
9        join;
10       lab;:
11           @(run)
12   }
```

(a) Kernel Code      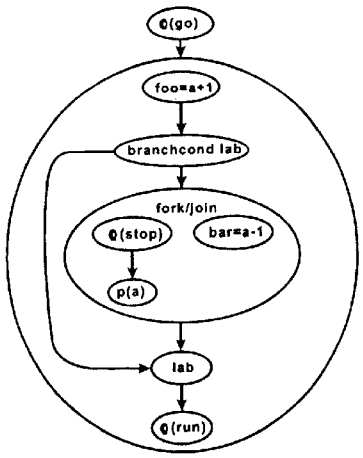 (b) NCFG      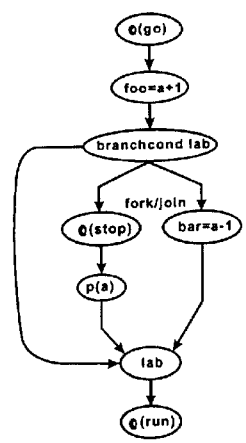 (c) CFG

FIG. 11

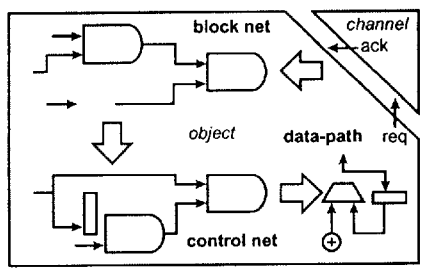

FIG. 12

```
BuidlCircuit(G;NCFG) { // G = (V,E)
    // allocate circuit templates
    foreach v∈V do
        // allocate circuit node
        dp_v = Data-Path(v);
        cn_v = ControlNode(κ(v));
        bn_v = BlockNode(κ(v));
        // wiring circuits allocated for the same vertex
        glue blk_local pin of bn_v with blk pin of cn_v
        if (κ(v)) == branch)
            glue the output of dp_v with cond of cn_v
        // next we deal with composite vertices, recursively
        if (κ(v) ==serial-composite ||κ(v) == parallel-composite)
            foreach G'∈ γ (v) do
                BuildCircuit(G')
            od
    od
    // wiring vertices
    foreach e: v_1→ v_2 ∈ E do
        if (κ(v_1) == branch)
            if (l(e) == t)
                allocate a wire connecting sel_t pin of cn_v1 to act pin of cn_v2
                allocate a wire connecting blk_o_t pin of bn_v1 to blk_i pin of bn_v2
            else if (l(e) == f)
                allocate a wire connecting sel_f pin of cn_v1 to act pin of cn_v2
                allocate a wire connecting blk_o_f pin of bn_v1 to blk_i pin of bn_v2
        else
            allocate a wire connecting sel pin of cn_v1 and act pin of cn_v2
            allocate a wire connecting blk_o pin of bn_v1 and blk_i pin of bn_v2
    od
}
```

FIG. 13

```
function checkLegality (G : (V,E)) returns {legal,illegal}
    σ ← ∅ // σ records the visited vertices
    foreach v ∈ V do
        if (v ∈ σ)
            continue;
        if (κ(v) = wait)
            continue;
        φ ← {v} // φ is the wave-front of vertices being visited
        ψ ← {v} // ψ can be reached from v without passing ⊙
        foreach u ∈ φ do
            φ ← φ - {u}
            foreach e: u → w ∈ E do
                if (κ(w) = wait)
                    continue;
                else if (w ∈ ψ)
                    return illegal
                else if (w ∈ σ)
                    continue;
                else
                    φ ← φ ∪ {w}
                    ψ ← ψ ∪ {w}
                fi
            od // foreach e : u → w ∈ E
        od // foreach u ∈ φ
        σ ← σ ∪ ψ
    od // foreach v ∈ V
    return legal
endfunction
```

FIG. 18

| | | | |
|---|---|---|---|
| 1: | *wait(<cond>)* | → | @(<cond>) |
| 2: | *wait(<cond>) watch(d) <stmt>* | → | if (d) { <stmt> }<br>else {<br>   @ (<cond>) [<d> : <stmt>]<br>} |
| 3: | @(<cond>) [<d>:<stmt>] | → | @(<cond> \| <d>);<br>branch (!<d>) <label_done>;<br><stmt>;<br>branch (1) <label_done>;<br><label_done>: |

FIG. 19

| | Basic Statements: | | |
|---|---|---|---|
| 1: | *<lhs> = <rhs>;* | → | <lhs> = <rhs>; |
| 2: | *<port>(...);* | → | <port>(...); |
| 3: | *safe <port>(...);* | → | safe <port>(...); |
| 4: | *<label>:  [d;<stmt>]* | → | <label>: |
| 5: | *<lhs> = <rhs>; [d: <stmt>]* | → | <lhs> = <rhs>; |
| 6: | *<port>(...); [ d:<stmt>]* | → | <port>(...); |
| 7: | *safe <port>(...); [d:<stmt>]* | → | safe <port>(...); |

FIG. 20

| | Conditional Statements: | |
|---|---|---|
| 1: | if (cond)<br>    <stmt1><br>else<br>    <stmt2> | → | branch(!cond) <label_else>;<br><stmt1>;<br>branch(1) <label_done>;<br><label_else>;<br><stmt2>;<br><label_done>: |
| 2: | if (cond)<br>    <stmt1> | → | branch(!cond) <label_else>;<br><stmt1>;<br>branch(1) <label_done>;<br><label_else>;<br><label_done>: |
| 3: | switch (<cond_expr>) {<br>    <tag_expr1>: <stmt1>;<br>    . . .<br>    <tag_exprn> : <stmtn>;<br>} | → | if (<cond_expr> == <tag_expr1>)<br>    <stmt1>;<br>else if (<cond_expr> == <tag_expr2>)<br>    <stmt2>;<br>. . .<br>if (<cond_expr> == <tag_exprn>)<br>    <stmtn>; |
| 4: | switch (<cond_expr>) {<br>    <tag_expr1>: <stmt1>;<br>    . . .<br>    <tag_exprn> : <stmtn>;<br>    default: <stmtd>;<br>} | → | if (<cond_expr> == <tag_expr1>)<br>    <stmt1>;<br>else if (<cond_expr> == <tag_expr2>)<br>    <stmt2>;<br>. . .<br>if (<cond_expr> == <tag_exprn>)<br>    <stmtn>;<br>else<br>    <stmtd>; |
| 5: | branch (<cond>) <label> ; [<d>:<stmt>] | → | branch (<cond>) <label>; |

FIG. 21

| | Loops: | | |
|---|---|---|---|
| 1: | *wherever(c) <stmt>* | → | `<label_loop>:; @(c) ;`<br>`<stmt>;`<br>`branch(1) <label_loop>;`<br>`<label_exit>:;` |
| 2: | *wherever(c)*<br>*watch(d) <stmtw>*<br>*<stmt>* | → | *if (d)* { *<stmtw>* }<br>*else* {<br>   `<label_loop>:; @(c);`<br>   `<stmt>[d:{stmtw>; branch(1) <label_exit>}];`<br>   `branch (1) <label_loop>;`<br>   `<label_exit>;`<br>} |
| 3: | *wherever(c)*<br>*restart(d) <stmtw>*<br>*<stmt>* | → | *if (d)* { *<stmtr>* }<br>`<label_loop>:; @(c);`<br>`<stmt>[d:{stmtw>; branch(1) <label_loop>}];`<br>`branch (1) <label_loop>;`<br>`<label_exit>:;` |
| 4: | *while (c) <stmt>* | → | `<label_loop>:;`<br>`branch(!c) <label_loop>;`<br>`<stmt>;`<br>`branch(1) <label_loop>;`<br>`<label_exit>:;` |
| 5: | *while (c)*<br>*watch(d) <stmtw>*<br>*<stmt>* | → | *if (d)* { *<stmtw>* }<br>*else* {<br>   `<label_loop>:;`<br>   `branch(!c) <label_exit>;`<br>   `<stmt> [d: {<stmtw>; branch(1) <label_exit>}];`<br>   `branch(1) <label_loop>;`<br>   `<label_exit>:;`<br>} |
| 6: | *while (c)*<br>*restart(d) <stmtr>*<br>*<stmt>* | → | *if (d)* { *<stmtr>* }<br>`<label_loop>:;`<br>`branch(!c) <label_exit>;`<br>`<stmt> [d: <stmtr>; branch(1) <label_loop>];`<br>`branch(1) <label_loop>;`<br>`<label_exit>:;` |

FIG. 22

| | Composite statements: | |
|---|---|---|
| 1: | fork {<br>    <stmt1> ‖ ... ‖ <stmtn><br>} → | fork<br>    <stmt1> ‖ ... ‖ <stmtn><br>join (0) |
| 2: | fork {<br>    <stmt1> ‖ ... ‖ <stmtn><br>} watch (w) <stmtw> ; → | ( fork<br>    <stmt1><br>    ‖<br>    ...<br>    ‖<br>    <stmt2><br>join (0) ) [w:<stmtw>] |
| 3: | ( fork<br>    <stmt1><br>    ‖<br>    ...<br>    ‖<br>    <stmtn><br>join (c) ) [p:<stmtp>] → | fork<br>    {<stmt1>; <label_done1>}<br>        [p:branch(1) <label_done1>]<br>    ‖<br>    ...<br>    ‖<br>    {<stmtn> ; <label_donen>}<br>        [p:branch(1) <label_donen>]<br>join (c ‖ p) ;<br>branch(! p) <label_exit>;<br><stmtp>;<br>branch(1) <label_exit><br><label_exit> |
| 4: | { <stmt1>; ... ; <stmtn> } → | { <stmt1> ; ... ; <stmtn> } |
| 5: | {<br>    <stmt1>; ... ; <stmtn><br>} watch(w) <stmtw>; → | if (w) { <stmtw> }<br>else {<br>    <stmt1> ; ... ; <stmtn><br>} {w:<stmtw>] |
| 6: | {<br>    <stmt1>; ... ; <stmtn><br>} [d: <stmtd>] → | {<br><stmt1> [d;{ <stmtd>; branch (1) <label_done>} ] ;<br>...<br><stmtn> [d;{ <stmtd>; branch (1) <label_done>} ] ;<br><label_done>:<br>} |

FIG. 23

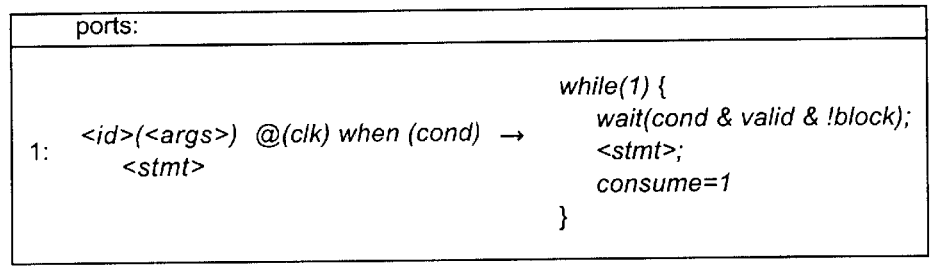
FIG. 24
```
wire bit w default 0;
foo(in1) @(clk) {
    w = in1 + 1;
}
bar(in2) @(clk) {
    w = in2 - 1;
}
priority bar > foo;
```
(a) V++ program
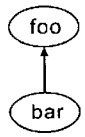
(b) Precedence graph
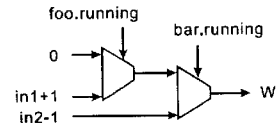
(c) Generated resolution logic
FIG. 25
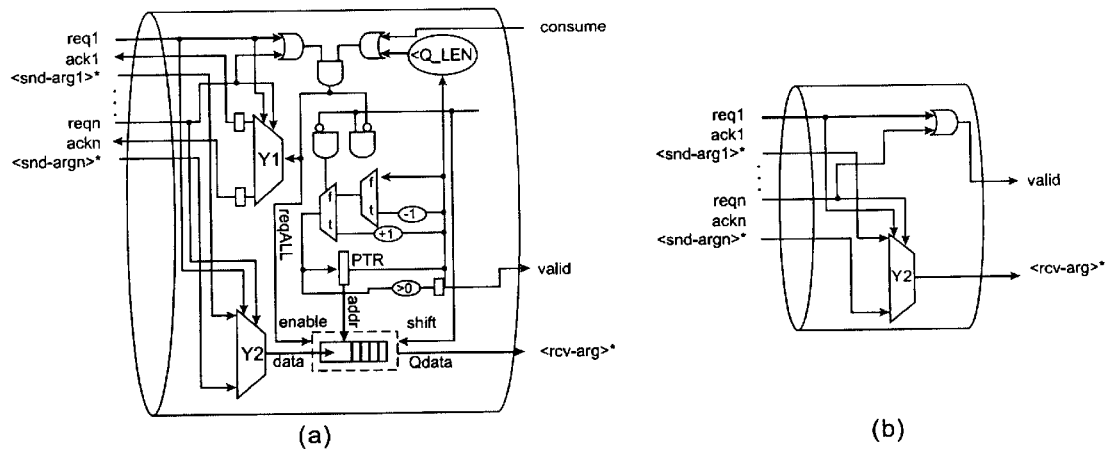
FIG. 26

```
Simulator(design)
    Simulate_Channels' (design)
    for simulation_cycle = 1, 2, ..., n
        foreach root r ∈ design
            Simulate_Object(root)
        Simulate_Channels(design)

Simulate_Object(object)
    foreach object instance o ∈ children(object)
        Simulate_Object(o);
    EvaluateLogic(object);    // Combinational Channels are evaluated here
    UpdateLatch(object);

Simulate_Channels' (design)    // this routine only evaluates logic once
    foreach channel c ∈ design
    EvaluateLogic(c);

Simulate_Channels (design)
    foreach channel c ∈ design
    EvaluateLogic(c);
        UpdateLatch(c);
        EvaluateLogic(c);    // to propagate the new latch value so that
                             // the receiving ports can see it.
                             // the 'next' hardware cycle actually starts from here.
```

FIG. 29

| Design | I. IP | II. V++(1) | III. V++(2) | III. V++(3) |
|---|---|---|---|---|
| Source Size (lines/bytes) | 1227/39K | 761/22K | 777/22K | 792/22K |
| SMV Size (lines/bytes) | 4923/111K | 2657/69K | 2613/68K | 2876/74K |
| blif Size (lines/bytes) | 13104/227K | 12100/226K | 12307/230K | 12357/225K |
| Mapped Area [2] | 13085 | 13374 | 13623 | 13688 |
| Mapped Area [3] | 11612 | 11673 | 11997 | 11793 |
| Mapped Area [4] | 129616 | 135728 | 136768 | 136536 |
| Mapped Area [5] | 122200 | 123400 | 126128 | 125032 |
| Latch Count | 409 | 483 | 491 | 466 |
| Literal Count | 12232 | 11611 | 11672 | 11459 |
| Design Time [6] | 8.5 days | 6 days | 0.5 days [1] | 0.5 days [1] |

HARDWARE DESIGN LANGUAGE FOR THE DESIGN OF INTEGRATED CIRCUITS

This appln claims benefit of Prov. No. 60/082,996 filed Apr. 24, 1998.

BACKGROUND OF THE INVENTION

This invention relates to the automated design of electronic circuits, and in particular to the automated design of integrated circuits using a computer system.

Digital systems are highly complex. The process of digital design is difficult and error-prone. With the help of software tools like synthesizers, simulators, verifiers, floor planners/routers, schematic editors, etc., it is now possible to design multi-million gate chips. Generally, each of these tools has its specific view and model of the world. To represent designs in a way that a tool can understand and manipulate, one uses certain languages. A Hardware Description Language (HDL) is a language used to describe the behavior of hardware so that it can be processed by the supporting CAD tools.

Historically, hardware designs are entered into a computer system using hardware description languages such as VHDL or Verilog. An HDL program was regarded as a description or model of the design. It also served as a simulation harness. These HDL's are based on a powerful, "universal" simulation mechanism—event queues. Event-driven simulation is a powerful model with which digital behavior at many levels of abstraction can be simulated.

VHDL and Verilog are the most widely used languages in which designs are described, simulated, and exchanged. The powerful simulation mechanism makes the languages not only hardware description languages, but also programming languages. Designers can describe mixed levels of abstraction of circuits, as well as test harnesses (the parts of designs which do not correspond to hardware, e.g., the I/O processing code used to setup stimulus to a circuit) in the same language, enabling simulation of the entire design. Due to their versatility, these event driven simulators have become an indispensable part of current design technology.

These powerful languages, however, do have problems. At the beginning, VHDL and Verilog suffered from being without a formal model. This means that given a program, it is hard to determine the meaning of a piece of code by reading the text without running the program. Even worse, the underlying simulation model can introduce nondeterminism, which makes it hard to determine if a bad simulation trace is a false alarm due to simulator induced nondeterminism or a design bug.

Another defect of these languages comes from their strength—they are too powerful to match perfectly with hardware. One can easily use these languages to write programs which have no corresponding hardware at all. To use these languages for both simulation and hardware synthesis, one needs to build hardware extractors for HDL programs.

Fortunately, there are models and languages that can be mapped to logic. They are the finite state machines (FSMs) and the synchronous languages. The fundamental assumption in these models/languages is that statements/logic execute arbitrarily fast in one "tick" (or one clock cycle) until they reach a stable state. In fact, this condition simply requires that the logic execute sufficiently quickly that the input signals at all latches are quiescent at the time latches are updated.

The powerful algorithms in these CAD tools have automated and speeded the design process. One major limiting factor for these tools, however, is the size of the circuits they can handle. One way to get around that problem is to decompose complex designs into smaller, managable pieces so that tools can operate on sub-circuits and generate results that can be combined. One problem with these FSM-based languages is that undefined or nondeterministic behavior can result when composing two modules, even though each by itself is well-defined. The problem is due to the fact that unrestricted communication among modules is permitted.

Accordingly, one of the goals of our invention is to provide an improved technique for the design of electronic circuits, which enables them to be represented by software, permits modules to interact with each other in a completely deterministic manner, and simplifies the design of complex circuits.

SUMMARY OF THE INVENTION

We have developed a Hardware Design Language we refer to as V++ that is designed to overcome the problems of prior art automated design techniques. In particular V++ provides a mechanism for capturing the design, not modeling the design. Previous hardware description languages like VHDL or Verilog are targeted at design modeling; the design itself was represented elsewhere. V++ presents a single, well-defined, tool-neutral semantics to the user. V++ solves the problem of compositionality—two well-defined V++ parts, when combined, are well-defined. V++ makes the execution flow explicit, enabling the use of well-developed optimization techniques on larger designs.

BRIEF DESCRIPTION OF THE DRAWINGS

FIG. 1 is a table illustrating visibility modifiers;

FIG. 2 is a diagram illustrating a compiler-generated communication mechanism;

FIG. 3 is a diagram illustrating a safe send with a bypass register;

FIG. 4 illustrates waveforms for the signals shown in FIG. 3;

FIG. 5 illustrates a leaking path from a receiver to a sender;

FIG. 6 is a table listing attributes;

FIG. 10 is a diagram illustrating port and process constructs;

FIG. 11 illustrates a kernel code segment, the corresponding nested control graph, and the control flow graph;

FIG. 12 illustrates the interaction among control net, block net, and data path;

FIG. 13 is the algorithm for building control nets, block nets, and data paths;

FIG. 18 illustrates the algorithm for checking the legality of an NCFG;

FIG. 19 illustrates the rules for wait statements;

FIG. 20 illustrates the compilation of basic statements;

FIG. 21 illustrates the compilation rules for conditional statements;

FIG. 22 illustrates the compilation rules for loops;

FIG. 23 illustrates the compilation rules for composite statements;

FIG. 24 illustrates the translation rule for ports;

FIG. 25 illustrates the resolution logic generated by priority statements;

FIG. 26 is a diagram illustrating synthesized logic for channels;

FIG. 29 is a diagram illustrating a simulator;

DESCRIPTION OF THE SPECIFIC EMBODIMENTS

V++ Generally

Figure 7:
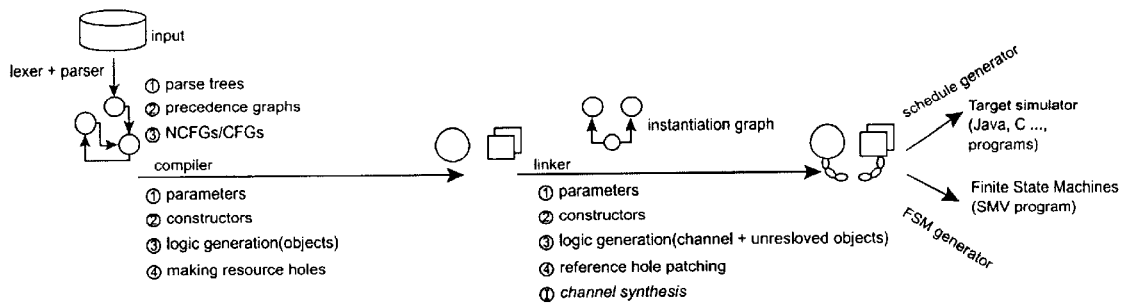
FIG. 7 is a diagram illustrating compilation flow.

One characteristic of a hardware signal is that it can have an essentially infinite series of values, varying over time. One difficulty of an interface is in ensuring that the writer of a signal holds the value of the signal until all readers have sampled it. One way to assure this is with a latch, synthesized by the compiler. Conceptually, each input of each module is latched. Each signal writer writes the latch input, and the synthesized interface holds the signal. The reader of the signal is thus isolated from the writers. This can be achieved by providing a mechanism of arbited FIFO's implicit in the semantics of V++. In contrast to software programming languages V++ uses program counters to know if valid input signals are present to perform computation.

The fundamental unit in V++ is the object. An object corresponds to a collection of ports and variables. The set of variables defines the states of an object, while the set of ports defines the external view of the object. An object is the fundamental unit of compilation in a design. The full source code for an object, together with the interfaces of the objects with which it communicates in the design, is sufficient to realize a hardware implementation or a complete simulation model of the object.

Communication among objects in a design is primarily via messages (or port invocations). Message passing in V++ involves sending a message to another object, or to itself. All message transmissions are non-blocking. A message is sent to the appropriate port of each object. Successful transmission of a message means that the synthesized communication device (channel) has contracted to deliver the message to the relevant recipient port, where the message will be held for the recipient until it is consumed.

Communication in V++

Communication via messages in V++ is fundamentally communication through latches. This is sufficient to ensure compositionality. On some occasions, however, Mealy-style communication is desired. Because this unlatched communication can be a source of difficulty in compositionality, we permit only a restricted form of Mealy communication. The mechanism for this is the public wire variable. A variable of a V++ object may only be assigned a value by code within the object. Public variables, however, are visible to ancestors of the object in the containment hierarchy. This restricted form of Mealy communication does not admit compositionality problems because wires always run strictly up the design hierarchy, never down, nor across the hierarchy. Thus, no loops are possible. Further, because the wired inputs to an object must come from the object's children, it is easy to schedule simulation code in V++. These are the only two methods of communication in V++. Because neither alone can cause compositionality problems, and since they do not interact, V++ is compositionally safe.

Computation in V++

Within an object, V++ is a synchronous language in that its model of computation is as a series of logic equations, which are solvable to a well-defined state. As such, for this portion of the system, a synchronous language is sufficient. An important assumption of V++ is that code within an object executes in zero time. Thus a two-stage evaluation procedure results in which logic evaluates to arrive at its solution, then latches update and messages are sent. In the preferred embodiment, we use a language like SMV for the computation.

In hardware, events happens concurrently. When designers design circuits, however, they tend to abstract the behavior of the design as a sequence of sets of operations. For example, consider a traffic light controller. It sequentially turns on and off the green, yellow, and red lights in response to car sensors and an internal timer. Conceptually, one can partition such a design into two parts—the sequencer (controller) and the data-path. At each instant, the sequencer activates, according to its current state and the sensor reading, appropriate data-path components to do the computation. That is, the sequencer controls the sequencing (flow) of data-path activation (execution). All activated components perform computation simultaneously. These data-path components, in turn, define the values of variables.

The flow of execution in V++ is made explicit by using processes as will be described below. A V++ process can be considered a sequencer plus data-path components. In addition to the general data-path operators, V++ incorporates control constructs to make the flow of execution explicit. V++ provides constructs to explicitly express parallelism and organize the transitions in sequencers. Next we describe the major constructs of V++.

The V++ Language

Objects

In V++ objects are the units of compilation. Each object contains a collection of object members which are variables, clocks, and ports. An object is a bundle of definitions that can be reused when the object is instantiated. V++ objects, however, do not have I/O wires. In V++, communication is via port invocations. Ports in V++ are similar to member functions/methods in object-oriented languages. Ports define how objects can react to port invocations by modifying variables in the containing objects. They define the services an object provides.

Object Members

In an object, each variable is an instance of an object, a channel, or a fundamental data type. A variable is a piece of hardware. The set of variables in an object define the state of the object. To change the state of an object, ports are provided. A port is a collection of control and datapath logic that manipulate variables.

The following example declares an object FSM which consists of one bit latch variable state.

```
object FSM {
    latch bit state;
}
```

A fundamental data typed variable can be either latches or wires by decorating the declaration with latch or wire. Latch variables are those which hold their values unless explicitly assigned. These variables sample their new values at discrete time points. Wire variables are unlatched and revert to default values (0) unless assigned. By default, a variable is a wire if it is not explicitly specified. In the above FSM example, if state is intended to be a wire, then it would be declared with:

wire bit state;

The visibility of variables and ports can be modified by visibility modifiers like public or private. If a variable is public, then that variable is visible to the outside world. If a variable is private that variable can be accessed (read or written) only within the enclosing object. By default, all variables are public unless declared private.

Objects are instantiated by variable declarations with the types replaced by appropriate object names. For example:

```
object Controller {
    FSM foo = new FSM();
}
```

In the above example, in object Controller, an instance named foo of object FSM is created.

Constructors

A constructor is code that is invoked only when a new instance of an object is created. In V++, because all hardware instances are created at compile/link time, constructors are executed only by the compiler/linker. Each constructor has the same name as the containing object. In addition, constructors are always public. Constructors are used to connect the instances of objects, to determine the initial values of latches, and to do initial port invocations. Consider the following example,

```
object Controller
    FSM foo;
    Controller (FSM f) {
        self.foo = f;
    }
}
```

As in the previous example, Controller contains a variable foo of type FSM. Unlike the previous example, however, foo is not a fresh instance. Instead, it "points" to another instance that is passed in (the formal argument f of Controller's constructor) by the object that instantiates Controller. The keyword self refers to the current instance of the enclosing object (Controller).

Initializing Latches

Latches are initialized by assigning to the init fields of the variables in an object constructor. For instance:

```
object FSM {
    latch bit state;
    FSM() {
        state.init = 1;
    }
}
```

In the above example, latch state in object FSM is initialized to 1.

Parameter Passing—Generators

To facilitate the description of reusable objects, parameters are introduced. Parameters allow designers to change the widths of variables, the number of iterations of loops, or replace constants with programmable variables. What is different from ordinary variables is that parameters should be reducible to constants at compile/link time. If this is not the case, then the program will be rejected by the V++ linker.

For parameterized designs, the generator construct (generate) is used to define the values of parameters.

```
1  object FSM {
2      bit[3:0] width;
3      generate(bit[3:0] wid) {
4          self.width = wid;
5      }
6      latchbit[width--1:0] state;
7  }
8  object Controller    {
9      FSM {2} foo = new FSM();
10 }
```

In the above example, foo is an instance of object FSM. Parameter ({2} at line 9) is passed to the FSM instance and is bounded to parameter width in the generator at lines 3–5. Therefore, the variable state (line 6) in FSM is a two-bit variable.

Ports

While the variables of an object define the state of the object, ports in the object define its behavior. A port receives zero or more arguments from senders and changes the values of variables in the enclosing object on the senders' behalf. It is the object's interface to the world. It exports the services provided by an object. As an example:

```
1  object FSM {
2      latch bit state; wire bit cond;
3      clock clk;
4      public count() (clk) when (cond) {
5          // the port body, to be executed when 'count' is active.
6      }
7  }
```

Line 3 declares a variable clk of type clock. Clock variables, which are essentially clock signals in circuits, are used to control the progress of systems. Lines 4–6 declare a port count that is visible to the external world. When the port is active, it consumes the input arguments and executes its port body statements. The port is synchronized by clk. That is, when one invokes count, it will not become active until clk arrives. The when clause defines the condition under which the body of the port may be active. It is called the guard of port count. The guard is conjuncted with the signal indicating the presence of input arguments to the port and the clock signal to determine if a port is active. More precisely, the port will be active only when (1) there is a valid argument that is not consumed by it yet, (2) clk is asserted, and (3) the guard cond is true.

Inside Ports

A port consists of a set of statements. These statements are the logic that change the values of variables. The way statements change the values of variables is via assignments. For example, the count port in the FSM example may contain the following conditional statement.

```
public count() (clk) {
    if (state < 1) {
        state = state+1;
    } else {
        state = 0; // If counter reaches max,
        reset it and stop counting.
    }
}
```

The if/else statement says that if the current value of state is less than one, then the new value of state (which will be effective when the next clock tick comes) will be the current value of state plus 1. Otherwise state will be reset.

In a port, all assignments must follow the single assignment rule (multiple assignments from different ports do not need to follow this rule). That is, statements like:

foo=1;

if (cond) foo=0;

are illegal since foo is assigned twice when cond is true. On the other hand, if (cond) foo=0;

else foo=1;

is legal because assignments to foo are under mutually exclusive conditions. Because checking for mutual exclusiveness of assignment conditions is conservative, the following statements:

if (cond) foo=0;

if (!cond) foo=1;

are also considered illegal.

Basically, V++ follows a "synchronous assumption." That is, all statements execute in zero time. If the left hand side of an assignment is a wire, then the assignment is effective immediately. On the other hand, if the left hand side of the assignment is a latch, then the assignment is not effective until the next clock cycle. For example, latch bit a, b;

a=b;

b=a;

will swap the value of a and b, but only at the next clock tick. As another example, consider the following V++ fragment.

latch bit a, c;

wire bit b;

a=b;

b=c;

Even though b is assigned "after" it is read, at the next clock cycle, "a" will get the current value of c. This is due to the fact that all assignments to wires take effect instantaneously.

Sending Messages to A Port

A port (sender) can activate another port (receiver) by port invocation. We also refer to the action of port invocation as "message sending." During port invocation the sender port sets up arguments (the message) to be passed to the receiver, and hands them over to a channel. Then the channel, which is essentially a communication device with internal buffers, delivers the arguments to the receiver port and turns on a flag indicating that a message is available so that the receiver can become active and consume the arguments when it is ready. As an example, the FSM counter may look like:

```
1  object FSM {
2      latch bit state; wire bit newState;
3      clock clk;
4      public count(bit keepCounting) @(clk) {
5          if (keepCounting) {
6              newState = state+1;
7              state = newState;
8              self.count(newState<1);
9          } else {
10             state = 0; // if counter reaches max, reset and stop
                  counting.
11         }
12     }
13 }
```

The count port takes a one-bit argument keepCounting which instructs if count should increase state or reset it. At line 8, port count invokes itself (self.count) with the argument newState<1. That is, whenever count is invoked by the external world, it starts counting by sending itself messages until it reaches the maximum (1 in this case), then it stops counting and the counter state is reset.

In a port, the single port invocation rule (it is forbidden to have multiple port invocations toward the same destination port at the same time) is followed. That is, V++ code segments like:

foo(bar);

foo(baz);

are forbidden.

Initial Port Invocation

To start the execution of a V++ program, one needs to do initial port invocation in the constructor of the containing object. In the above FSM object, if we want to initialize state to 0 and start counting from the beginning, then we may have constructors similar to the following segment:

```
FSM () {
    state.init = 1;
    count (1);
}
```

Thus, for initial port invocations, all that the V++ compiler/linker does is setting the initial states of the latches in the channels.

Conditional Statements

Conditional statements are useful in controlling the effectiveness of one or more groups of statements. In V++, there are two conditional statements { the if/else statements and switch statements. The simplest form of conditional statement is the if/else statement:

if (<conditional-expression>) <statement 1>[else <statement2>]

Note the square bracket around the else branch of the conditional statement indicates that the branch is optional. An if statement without matching else branch is said to be incomplete. If <conditional-expression>evaluates to 1 (true), then <statement1> is executed, otherwise <statement2> is executed. That is, if (s) o=a; else o=b;

amounts to o=s ? a:b;

In terms of hardware, the above statement corresponds to a multiplexer with output o and inputs a and b. The multiplexer is controlled by s. In the above conditional statement, if the else branch is omitted, then o will fall back to its default value when s is 0.

Nested conditional statements are allowed. Therefore, it may cause confusion when statements similar to the following are given:

```
if (c1)
    if (c2)
        o = a;
    else
        o = b;
```

It is unclear whether the else branch belongs to the first if (c1) statement or the second if (c2) statement. In V++, it is defined that an else branch always corresponds to the "closest" (in syntactic order) incomplete if statement. Therefore, in the above example, the else branch belongs to the if (c2) statement.

A more complex form of conditional statement is the switch statement. In a switch statement, the first case tag that matches with the switch expression is executed. That is, a switch statement of the form:

```
switch (<switch-expr>) {
    case (<tag1>) : <statement1>
    case (<tag2>) : <statement2>
    . . .
    case (<tagn>) : <statementn>
    default: <statement default>
}
amounts to
if (<switch-expr> == <tag 1>) <statement1>
else if (<switch-expr> == <tag2>) <statement2>
. . .
else if (<switch-expr> == <tagn>) <statementn>
else <statement default>
```

Constructor Loops

In V++, array loops are available to describe arrays of regular structures. These loops are expanded by the compiler/linker at compile/link time. For example,

```
bit[2:1] a;
bit[2:1] b;
bit[2:0] c;
bit[2:1] s;
bit[1:0] i;
. . .
c[0] = 0;
array (i=1; i<=2; i=i+1)
    c[i] = (a[i] & b[i]) | (b[i] & c[i-1]) |
           (a[i] & c[i-1]);
    s[i] = a[i] ^ b[i] ^ c[i-1];
]
``` is a two-bit carry ripple adder. a and b are the two operands, c is the carry signal (c[0] is carry-in and c[2] is carry-out), and s is the sum. Since array constructs are expanded statically, their bounds should be able to be reduced to constants at compile/link time.

Interaction Among Ports

In V++, a variable can be touched by several ports. In case there is contention, the value of the variable will be determined by a V++ compiler generated resolution logic. In the mean time, V++ warns about such contention among ports. Basically, the port with the highest priority determines the new value of the variable. By default, the port that is declared first in an object will have the highest priority. Priorities can be changed by using the priority keyword:

```
1  object FSM {
2      latch bit state;
3      clock clk;
4      public count() @(clk) {
5          if (state < 1) {
6              state = state+1;
7              self.count ();
8          }else{
9              state = 0; // if counter reaches max,
                          reset it and stop counting.
10         }
11     }
12
13     public setCounter(bit value) @(clk) {
14         state = value;
15     }
16
17     priority setCounter > count;
18 }
```

In the example, a new port setCounter is added. When setCounter is invoked, it forces the next value of state to be value, which is setCounter's argument. By default, if the priority statement at line 17 does not exist, when both count and setCounter are active, setCounter has no effect on state since count has higher priority (it is declared first). However, the priority statement at line 17 makes setCounter have higher priority.

In case no port is assigning to a variable, the variable falls back to its default value. For a latch variable, the default value is its current value. For a wire variable, 0 is the default value. The default values for wires can be changed by attaching default clause to the declaration.

wire bit[3:0] foo default 1;

declares a 4-bit variable foo whose default value is 1.

Combinational Ports

Generally, there is a unit (or more) delay between when a port is invoked and the time it becomes active and executed. If a port is not synchronized by a clock (i.e., without the @ clause), it is referred to as a combinational port. Otherwise it is termed a sequential port. A combinational port can still be guarded by a when clause. Invoking a combinational port involves zero delay. That is, the channel that delivers arguments to a combinational port does not utilize latches to buffer arguments. In addition, senders to a combinational port cannot determine if the message has been successfully delivered. Therefore, in case a combinational port is blocked (e.g., the guarding condition is not met), the incoming request can be undelivered.

Combinational ports are private and, as such, can only be accessed in the containing object. This restriction ensures that all objects are Moore machines at their boundaries.

The following object uses combinational ports to implement the FSM shown above.

```
1  object FSM {
2      latch bit state;
3      wire bit nextState;
4      clock clk;
5      public count() ~(clk) { // a sequential port
```

-continued

```
6        if (state < 1) {
7            self.count();
8        }
9        computeNSO;
10       state = nextState;
11   }
12
13   computeNS() { // a combinational port
14       if (state < 1) {
15           nextState = state+1;
16       }else{
17           nextState = 0;
18       }
19       }
20   }
```

The port computeNS is a combinational port which updates the value of nextState. Port count ptakes the value of nextState computed by computeNS and updates the value of state.

Functions

An alternative way of describing combinational logic is to use functions. All functions are private, and invocation of functions induces zero delay. A function is declared by the function keyword, following by the width of the return value, the name of the function, the arguments to the function, and the function body. The following example implements the FSM object using functions.

```
1    object FSM {
2        latch bit state;
3        clock clk;
4        public count() @(clk) {
5            if (state < 1) {
6                state = fullAdder(state, 1, 0);
7                self.count();
8            }else{
9                state = 0;
10           }
11   }
12
13       function bit[1:0] fullAdder(bit i1, bit i2,
             bit ci) {
14           // a,b is variable concatenation
15           fullAdder = ((i1&i2) | (i2&ci) | (ci&i1), i1^i2^ci);
16       }
17   }
```

In the above code, at line 6 there is a function call to fullAdder whose definition is located at lines 13–15. A function returns values by assigning to the name of the function (line 15).

Comparison of Combinational Ports and Functions

There are some differences between functions and combinational ports. Basically each call to a function instantiates a non-shared copy of hardware which implements the functionality. On the other hand, a combinational port can be potentially shared by several ports. That is, via combinational ports, different ports can send messages to the same piece of combinational logic without duplicating the logic. All messages going into a combinational port, however, need to go through a resolution logic. On the other hand, the inputs to functions are directly wired to the function body.

Port Sharing—When a Port is Invoked by Multiple Sources

If a port is receiving mess ages from two or more ports, then the channel that is delivering messages has to resolve the possible contention if multiple ports send messages to the same destination at the same time. Consider the following counter example:

```
1    object counter {
2        clock clk;
3        public start() @(clk) {
4            doCount(4'b0000); // 4-bit literal, value 0000
5        }
6        doCount(bit[3:0] value) ~(clk) {
7            if (value4'b1111) {
8                doCount(value+1);
9            }
10       }
11       privilege(doCount) doCount > start
12   }
```

Each time port start is invoked, it invokes doCount to count from 0 to 15. doCount counts by sending itself messages. Once the counter value reaches 15, doCount stops counting. Instead of the storing the state of the counter in a latch variable, the current counter value is stored in the value argument of doCount. Port doCount( ) is invoked both from sequential port start (line 4) and sequential port doCount (line 8). If both ports try to invoke doCount at the same time, they need to be resolved. By default, in a compiler/linker synthesized channel, a priority decoder is used to arbitrate among multiple port invocations. If it is desired to explicitly control the priority among multiple port invocations with the same target port, then privilege construct can be used. In the above example, the privilege statement at line 11 states that, among those port invocations for doCount, port doCount has higher priority than port start. Thus once the counter starts counting, it will not be interrupted. If one wants to control more details of channels, user defined channels can be used.

Controlling What is Visible from Outside an Object—The Variable Visibility Rules In V++, by default, all hardware inside an object (wires, registers, or port/logic) are visible from outside the object. However, problems may arise when other objects are using variables that are intended for internal use only (imagine what will happen if another object is allowed to observe the internal of a encryption chip). To avoid the misuse of hardware resources, one can control the visibility of variables or ports by using visibility modifiers.

The visibility modifiers (public and private) specify the accessibility of member Variables and ports in objects. FIG. 1 summarizes how visibility modifiers affect the accessibility of resources.

Latched Inputs

For certain designs, it is desirable that the sender and and the receiver be loosely coupled in such a way that no explicit exchange of data is performed between the two. Instead, the sender drives a variable so the receiver can latch it if it wishes. If this type of communication happens inside one object, then a latch serves the purpose. If this happens between a pair of ports belonging to different objects, however, then according FIG. 1, this cannot be done if a parent tries to drive a variable and makes it visible to its child. To avoid the problem, latched inputs are introduced.

Latched inputs are latches declared inside an object that are modifiable to the parent of the object (in the instantiation hierarchy). The object containing the input latch can control the enable of the latch. That is, while the parent sets the value of the latch, the child determines when the latch samples the input by setting an enable signal associated with the latched input variable. By default, the enable signal is glued to constant one if not explicitly assigned.

Consider the following program:

```
1  object foo {
2      clock clk;
3      bar bi = new bar(); // create a new instance of bar
4      a(bit i) @(clk) {
5          bi.1 = i;
6      }
7  }
8  object bar {
9      input latch bit 1;
10 }
```

In the above example, whenever port foo.a is invoked, latch bar.1 (variable 1 of object bar) is set, to the argument i of port foo.a (line 5). In object bar, associated with input latch 1 is an enable signal named 1.enable. 1.enable is private to object bar. If this signal is asserted, then latch 1 will load whatever value that is assigned from its parent. Otherwise the latch retains its previous value.

Channels

When one port sends a message to another port, the message is delivered via a channel. Channels are communication networks by which ports talk to each other. Channels take the responsibility of faithfully delivering messages from invoking ports to invoked ports once messages are sampled. Unlike ports or objects, channels are not translated into hardware until the linkage phase when the entire design is available. In other words, objects direct compilers to generate hardware while channels direct linkers to generate hardware which is glued with the modules generated by the compiler.

Default Channels

The default channel generated by the V++ compiler is a multiple-writer-single-reader communication device with buffering queues. Consider the following example,

```
1  object two.guys {
2      clock clk;
3      latch bit[3:0] count;
4
5      sender() @(clk) {
6          self.receiver(count);
7          count = count + 1;
8      }
9      receiver(bit[3:0] count) ~(clk) {
10     }
11 }
```

At line 6, port receiver is invoked with the current value of count as its argument (or we can say that a message is to be delivered from sender port to receiver port). By default, V++ generates a channel which uses FIFO buffers to queue the messages to be sent. When the message arrives at receiver and when clk is high, receiver becomes active and the message is consumed. FIG. 2 illustrates how port invocation (line 6) is compiled. The default port invocation is non-blocking, that is, the invocation always terminates in one clock cycle.

When the port invocation at line 6 is executed, req is asserted and the arbitration logic in channel has to determine if it has enough capacity to process the request. If so, the data (counter) is stored in a FIFO resides in the channel, and the channel will assert a valid signal for receiver in the next clock cycle. The receiver body statement will be enabled when valid is held high. On finishing the execution, the receiver asserts consume so that the channel can advance its FIFO pointer.

The default message send involves minimum interaction between the port invocation statement and the channel in the sense that the port invocation does not query the "return" value for a message delivery attempt. That is, the port invocation does not know if the arguments have been successfully sampled. Therefore, in case the buffer is full when one tries to send a message, the message will get lost. Safe channels are provided to prevent messages from getting lost.

Safe Channels—Channels That Do Not Drop Messages on the Floor

By default, when a V++ port sends a message through a channel, it asserts a request signal and holds data at the same time. If the message cannot be delivered. The sender will not be aware of the undelivered message. That is, if a sender sends a message without checking for acknowledgment, the data can potentially get lost if the channel cannot deliver the message (e.g., if another port with higher priority is also sending via the channel at the same time or the channel buffer has reached its limit).

To eliminate the possibility of message loss, a mechanism to catch message sending failure and control the digestion of port inputs is provided. The key is in a set of auxiliary latches called the shadow registers.

For each safe port invocation, a set of auxiliary latches (shadow registers) are allocated to store the values that are to be passed to the destination channel. If the message can be delivered in one clock cycle, the values stored in the registers will not be used. However, in case in the next clock cycle the arbitration logic in the channel determines that the data cannot be latched properly, the data are latched into the shadow registers and the shadow registers keep requesting the channel for message delivery in the following clock cycle(s) until it succeeds. When the shadow registers are trying to send the stored messages, the sending port blocks itself from consuming incoming data. Consider the following fragment:

```
1  object two_guys {
2      clock clk;
3      wire bit global;
4      sender(bit in1) @(clk) {
5          safe receiver(in1);
6      }
7      receiver(bit in2) @(clk) {
8      }
9  }
```

It is compiled into the circuits similar to the one shown in FIG. 3. The flag ack, which is one clock lag behind the corresponding request, indicates if the channel has a chance to sample the data to be delivered. If ack is low one clock after a message send request, then the sender port switches to a busy sending mode in which it stops consuming any incoming messages (by setting enable' to low) and keeps sending the data (from the shadow registers) until ack is set high. The time ack is set, the sender can immediately resume execution. If sender uses variable global as an argument to receiver at cycle i and is blocked, then the value of global at the i-th cycle will be used as the argument for the resends that follow (because the shadow register has latched the value of global at the i-th cycle), no matter what global's values at cycles i+1, i+2, . . . are going to be.

Waveforms of the above circuit are shown in FIG. 4. In FIG. 4, it is assumed that at the i-th cycle, the FIFO for the sender in FIG. 4 is already full. Therefore, when sender tries to send a message at the i-th cycle, ack will be held low at the i+1-th cycle. sender is therefore blocked from consuming its input at the i+1-th cycle, if there is any. In the meantime, sender keeps trying the pending send by holding request and data lines. At the i+1 cycle, since the consume bit from sender is held low, the input channel to sender has to hold the valid bit (and input data to sender) at the i+1-th cycle, asserting that a valid token is available. Assume that at the i+2-th cycle, ack signal is set, indicating that data from the i-th cycle has been latched. At this time, sender then continue to consume the second message on its input channel and request another message send. The waveforms show that the second request goes through.

Now, suppose that a port contains a mixture of safe (blocking) and default (nonblocking) port invocations at the same time:

```
1  object two.guys {
2      clock clk;
3      latch bit 1;.
4      wire bit w;
5      sender(bit in1) @(clk) {
6          safe receiverS(in1);
7          l = in1 + 1;
8          w = in1 - 1;
9          receiverU(in1);
10     }
11     receiverS(bit in2) @(clk) {}
12     receiverU(bit in3) @(clk) {}
13 }
```

Assume that at the i-th cycle sender tries to send a message to receiverS but fails. w still gets assigned to in1−1 at the i-th cycle and 1 gets in1+1 (at the i+1-th cycle, since it is a latch). In addition, a message is sent to receiverU with the value of in1 at the i-th cycle. Assume that there are one or more safe port invocations at the same time, then the sending port cannot take new messages until all the safe port invocations go through.

Alternative Safe Channel Proposals

Apart from the safe port invocation scheme presented above, several candidates form implementing safe port invocations are also considered. In this section, these approaches are discussed.

Get Channel Status as Return Value

The most straightforward way to check if a message send is successful is to use the acknowledgment signal (unlatched) from the channel as the return value for a port invocation so that the V++ program flow can take into account the case that a message cannot be delivered. For example, in the following code segment, port foo first sends a message to bar. If the message cannot be sampled by the channel, then a 0 is returned, which will enable foo to try another port baz.

```
foo () @(clk) {
    if (bar()) }
    } else if (baz()_ {
    }
}
```

The advantage of this approach is that the circuit for implementation is simple and the semantics are powerful. One can invoke a port, call another port (like error handler) if the first invocation can not succeed. All of these can be done in the same clock cycle. In addition, one can implement an arbitrarily complex sequence of "try-and-handle" actions using deeply nested if/else statements and port invocations.

Instantaneous Blocking Send

One way to get around the potentially long combinational path is to use the acknowledgment signal from the channel to control the progression of the sending block as shown in FIG. 5. This can lead, however, to "backward combinational leakage" from the receiver to the sender port. If sender and receiver invoke each other, then a combinational loop will be formed, even if the two ports are in different objects.

To prevent the backward combinational path sneaking between senders and receivers, one way is to insert a latch on the acknowledgment signal (ack). Unfortunately, this extra latch will cut the performance of the sender to half of its top throughput. This is because for each safe port invocation, it has to spend at least another cycle waiting for the returning acknowledgment before it can proceed and do the next computation.

Prerequest

Inserting latches on the acknowledgment signal alleviates the backward combinational path problem, but can degrade the performance. One way to save the extra cycle for each safe send is to assert the request line (it is also referred to as "pre-request" in the rest of this section) one clock before the port really needs to use the channel. The following code implements this pre-request mechanism by attaching a small combinational circuit (requireNext clause) to the sender port to raise the request signal to the appropriate channel (channel ch1, which is the channel that delivers messages to receiver port, as is indicated by line 4) one cycle before sender actually does port invocation. The execution of the sender is then guarded by the acknowledgment from the channel (ch1.ack).

```
1  object twoguys {
2      sender() ~(clk) when(ch1.ack) requireNext(ch1,1) {
3          latch bit[3:0] count;
4          ch1: receiver(count);
5      }
6      receiver(bit[3:0] counter) (~(clk) {
7      }
8  }
``` requireNext (line 2) is a keyword that keeps sending request (the second argument. which should be a boolean expression) to the first argument (channel ch1). requireNext tells ch1 that. In the next clock cycle, it is going to send a message and requests for permission.

The channel ch1 sends an acknowledgment signal via variable ch1.ack (when clause, line 2) to guard the execution of sender. That is, if ch1 does not grant the transmission (e.g., due to buffer overflow), sender cannot initiate message sending. Therefore, messages will not get lost. However, the pre-request approach has the drawback of being too conservative. One cycle before the execution of the port body, the sending port needs to lock the channels that will be used. Because the body is not executed yet, all it can do is to lock all the channels that can potentially be used in the future. This can result in holding more resources than necessary.

User Defined Channels

Like stacks in programming languages, channels perform like a standard communication glue binding different objects (ports). In hardware, the requirement for communication glues for different designs may vary drastically. It is therefore desirable to allow designers to create their own glues. User defined channels in V++ allow users to devise their own communication devices.

```
1  object twoguys {
2      clock clk;
3      arbiter a = new arbiter(); // arbiter is a user defined channel,
       see below
4      latch bit[3:0] count;
5
6      sender() @(clk) {
7          self.receiver(count) via a;
8          count = count + 1;
9      }
10     receiver(bit[3:0] counter) @(clk) {
11     // message is received from the user defined channel a.
12     }
13 }
```

The port invocation at line 7 is followed by a clause via a, where a is an instance of a user defined channel arbiter. This statement sends a message to receiver port by using channel a. Note that one port can take messages only from one channel. Therefore, if another port wants to send messages to receiver, the messages also must be delivered by a. The following is channel arbiter code:

```
1  channel arbiter(clkSnd, req, ack, dataIn)
2              (clkRcv, valid, consume, dataOut) {
3      // left, right are compiler provided attributes for arrays.
4      clock [] clkSnd;
5      input bit [] req;
6      output bit [] ack;
7      input bit[] [3:0] dataIn;
8      clock [] clkRcv;
9      output latch bit[] valid;
10     input bit [] consume;
11     output bit[] [3:0] dataOut;
12     wire bit [ack.left+1: ack.right] [3:0] retVal;
13     latch bit[3:0] q; // the 'FIFO'
14     wire bit [ack.left+1: ack.right] reqPending;
15     wire bit[3:0] i;
16
17     run () @(clkR[0] = 0;
18         retVal[0] = 0; reqPending[0] = 0;
19         array (i=req.right; i<=req.left; i = i + 1) {
20             // the resolution logic is simply a wired-or of
             all input data.
21             if (req[i]) {
22                 retVal[i + 1] = retVal[i] I dataIn[i];
23                 reqPending[i + 1] = 1;
24             }else{
25                 retVal[i + 1] = retVal[i];
26                 reqPending[i + 1] = reqPending[i];
27             }
28         }
29         // note: new data always overwrite q.
30         q = retVal[req.left + 1];
31         if (reqPending[req.left + 1]) {
32             // retVal is sent (latched) to the receiver.
33             dataOut[0] = q;
34             valid[0] = 1;
35         } else if (consume[0]) {
36             valid[0] = 0;
37         }
38     }
39 }
```

The arbiter channel has two sets of arguments. The first set of arguments (sender interface, line 1) are from the senders that send messages via the channel. The second set of arguments (receiver interface, line 2) are glued to the receiver end.

For the first group of arguments, clkSnd is an array of clocks of sender ports, req is an array of send-requests, and ack is an array of acknowledgment signals from the channel (the pairs of square brackets [ ] in lines 4–7 represent arrays whose dimensions cannot be determined yet). req is asserted when a sender requests to send a message via the channel. clkSnd, req, and ack are not explicitly shown in the argument list of a port invocation. They are inserted by the V++ compiler. dataIn is an array of the data to be sent. One of its element (dataIn[0] in this example) will be glued to variable count of port sender at line 7 of object two_guys. The dimensions of these variables (clkSnd, req, ack, and dataIn) are equal to the number of senders hooked up to the channel.

For the second group of arguments, the first argument (clkRcv) is the receiver's controlling clock. The second argument (valid) indicates if a message is valid so that the receiving port can be activated. valid is latched and clocked by the receiver's controlling clock. The third argument (consume), which is an input to the channel, indicates if the receiver has consumed the message. If the message is consumed and there is no further message to be sent to the receiver valid will get reset. The fourth argument (dataOut) is the data to be passed to the receiver. It is glued with the receiver port's input arguments. req.left and req.right (line 19) are the leftmost and rightmost indices of array req, respectively. req has as many elements as the number of sending ports that are hooked up to the channel. Therefore, req.left and req.right will be determined only at link time.

The array statement at line 19 is an iterative constructor which is expanded according to the range determined by its lower bound and upper bound. The body of the array statement is copied as many times as specified by the range of the array construct.

In the user defined channel, there is a group of statements named run which is guarded by @(clkR[0]) (line 17). This group of statements is executed only when the guarding clock is asserted. In a channel, there may be multiple run groups.

In the above channel example, the FIFO for buffering messages is a simple latch (q at line 13). The resolution logic is a wired-or of all the data from the ports that are trying to send messages. The connection between the ports (sender and receiver) and the user defined channel arbiter is similar to that shown in FIG. 27.

Broadcast—Sending Message to Channels

The usual port invocation is appropriate for normal point-to-point communication. If one wants to do broadcast, the port invocation mechanism may not suffice. To broadcast a message, one sends it to a channel, instead of to a specific port and allows the channel to determine the right port(s) that will receive the message.

```
1  channel ch (cin, req, ack, din) (cout, valid, consume, dout) {
2      clock[] cin;
3      input bit[] req;
4      output bit[] ack;
5      input bit [] din;
6      clock[] cout;
7      output bit[] valid;
8      input bit [] consume;
9      output bit [] dout;
10     . . .
11 }
12 obJect foo {--
13     ch ci = new ch();
14     wire ack;
15     clock clk;
16     a (bit in) @(clk) {
17         ci(clk, 1, ack, in)();
18     }
19 }
```

In this example, the channel ci invocation (line 17) connects the arguments (clk, 1, ack, and in of port a) to the first group of arguments of channel ci (cin, req, ack, and din, respectively). The channel invocation does not contribute to the second group of arguments (the receiver interface). Therefore, the second group of argument is empty (( ) at line 17). When a is invoked, it requests ci to send data in. ci then has to determine where to send the data. If desired, a channel invocation can contribute both to the sender interface and the receiver interface.

Attributes

There are occasions when designers want to fine-tune the behavior of synthesized hardware. For example, one may want to allocate a specific number of FIFO entries in a specific channel. To access the details of a V++ design and fine-tune the behavior of synthesized hardware, attributes can be used. The attributes that are available in V++ are listed in FIG. 6.

There are three classes of attributes. First, there are attributes that designers can set to change the synthesized hardware. For example, one can use depth property to fine-tune the number of FIFO entries of channels:

public count( ) t~(clk) depth(7) { }

In the previous example, the count port declaration explicitly specifies the size of the FIFOs of the channel which delivers messages to count to be 7.

Attributes can also be used to check the status of ports. For example:

if(count.running) {
   receiver 0;
   } says that if port count is running, then send a message to receiver.

Finally, attributes can be used to access the characteristics of variables. For example, given an array variable foo, foo.left and foo.right give the left and right boundary indices of its highest dimension, respectively.

Processes

V++ ports are suitable for describing a circuit's single cycle reaction on receiving a message. It is sometimes desirable, however, to describe reactions that span multiple cycles. In this case, processes are provided to describe such multi-cycle reactions.

A process basically overlays a controller FSM over a set of data-path components. At each clock cycle, the controller selects some of the data-path components for execution. The selected data-path components then change the values of variables. The V++ language provides a set of powerful constructs to help organize the controller FSM transitions.

Introducing Delays in Processes

In a process, a wait statement is used to decompose a group of statements into multi-cycle execution sequences. Consider the following process.

```
1 process foo(bit in) ~(clk) when(enable1) {
2     <stmt1> --
3     wait(enable2);
4     <stmnt2>
5 }
```

Assume that the process is invoked at the i-th cycle, then <stmti> will be executed in that cycle. Then it encounters the wait statement at line 3 where it waits for enable2 (it can be any expression which evaluates to 0 or 1) to become true. Then <stmt2> is executed (at the same cycle when enable2 turns true). <stmt2> will be executed at no earlier than the i+1-th cycle. That is, if enable2 turns true at the i-th cycle, foo will not be able to sense it (and execute <stmt2>). If input in is referenced in <stmt2>, its value at the i-th cycle (when process foo is invoked) will be used.

Flow Control in Processes if/else statements provide flow control in processes. Given the following example:

```
1 <stmnt1>;
2 if (cond) {
3     <stmt2>;
4     wait(trigger);
5     <stmt3>;
6 }else{
7     <stmt4>;
8 }
9 <stmnt5>;
```

Assume that cond is true, <stmt1> and <stmt2> will be executed in the same cycle. Then <stmt3> (and <stmt5>) will get executed at least one cycle later when trigger is asserted. If cond is false at the beginning, then <stmt1>, <stmt4>, and <stmtS> will get executed in the same cycle.

While statements provide loops in V++. A while statement introduces zero delay. That is, on entry, it evaluates the conditional expression, if the result is true, the first statement inside the while statement is executed. Otherwise the first statement that follows the while statement is executed. When execution flow reaches the end of a while statement, it restarts the while immediately (with zero delay). Consider the following example:

```
1 process foo(bit in) @(clk) {
2     <stmt1>;
3     while (cond) {
4         wait(trigger);
         if(c)
5             <stmt2>;
6         else
7             break;
8     }
9     <stmnt3>;
10 }
```

Assume that the process is invoked at the i-th cycle, <stmt1> is immediately executed in that cycle. Assume that cond is true, the while loop will be entered and the process will wait for trigger to come true. Whenever trigger turns true, the if/else statement (lines 4–8) will be executed. The break statement at line 7, when executed, aborts the while loop and resumes execution at the statement (<stmt3>) that follows the aborted while statement.

If cond is false at the i-th cycle, then only <stmt1> and <stmt3> will be executed in the i-th clock cycle.

There are two ways to break out of a while loop. First, if the conditional expression of the while statement evaluates to false when it is executed, the loop is terminated. Second, if break statement is encountered in a while statement, the loop is immediately terminated and statement that follows the while statement is executed (in the same cycle).

Another way to alter the flow of execution in loops is to used the continue construct. It re-executes the loop construct immediately when it is executed. However, if the conditional expression of the while loop construct does not hold, then the loop will terminate immediately.

Another form of loop statement is the whenever loop:

whenever(cond_expression) <body_statement>

A whenever loop never terminates. When a whenever statement is executed, it waits for its conditional expression to turn true. Then it executes the body statement. The above whenever statement is effectively the following while statement:

```
while (1) {
    wait (cond_expression);
    <body.statement>
}
```

Loops and Delays

V++ imposes restrictions on the allowable combinations of loop constructs to ensure that any statement does not get executed more than once at any instant. The rule is that along any loop in a V++ program, there must be at least one wait statement (delay) in that loop.

Creating Execution Threads

V++ allows designers to introduce execution threads (a thread is a sequence of statements that can be executed concurrently with other threads) in a process by using the fork statement. Basically, a fork statement spawns a set of concurrent sequences of statements, separated by || (each sequence of statements is also called a branch of the fork statement), that will be synchronized when they finish execution. The set of threads are executed in parallel when the fork statement is executed. The fork construct can be executed instantaneously. That is, it introduces zero delay on entering or exiting. Consider the code fragment:

```
<stmt1>;
fork {
    <stmt2>; || <stmt3>;
}
<stmt4>;
```

Assume that <stmt1> is executed at the i-th cycle, then <stmt2> and <stmt3> will execute at the i-th cycle. <stmt4> will execute whenever both <stmt2> and <stmt3> are finished. That is, assume that <stmt2> finishes at the j-th cycle and <stmt3> finishes at the k-th cycle, then <stmt4> can be executed at the max(j, k)-th cycle.

Interactions Between Safe Port Invocations and Processes

When a process does a safe port invocation, it does not know if the message can be successfully sampled until the next clock cycle. Assume that the sending process is informed that the safe port invocation cannot go through, then the process should suspend the execution of all its statements. Suppose that the suspended safe port invocation does not block the sending process from execution. Consider the example below:

```
1  while (1) {
2      wait(trigger);
3      safe foo();
4  }
```

Assume that line 3 is executed at the i-th cycle and trigger is asserted at the i+1-th cycle. If the safe port invocation does not go through, then the above code segment will try to do two safe port invocations from the i+1-th cycle (one starting from the i-th cycle, the other starting from the i+1-th cycle). Because this is undesirable, the amount of hardware to implement a piece of code should be decidable at compile/link time.

In V++, when a process executes safe port invocation in one cycle (cycle i), the acknowledgment signal (from the safe port invocation) guards the effectiveness of the wait statement that will be active in the next cycle. That is, if the safe port invocation does not go through in the next clock cycle, then no wait statement will be sensitive to their waiting conditions. What this implies is that no statement (other than re-send) will be executed in cycle i-i-1. The process keeps suspending the execution of all its statements until all the safe port invocations executed in cycle i get finished. Assume that the last safe port invocation finishes at cycle j (the acknowledgment signal is asserted at cycle j), then the process resumes execution of its statements at cycle j.

Consider again the example above. Assume that foo is invoked at the i-th cycle (line 3). The control is, in the mean time, transferred to the wait statement at line 2, where it waits for trigger to become true starting from (including) the i+1-th clock cycle. If the safe foo( ) port invocation does not succeed at the i+1-th cycle, then the control flow will stop at line 3, waiting for the safe send to complete, even though trigger is true. Suppose that at the j-th cycle (j>i) the safe send is done, the wait statement will then become effective (sensitive to trigger) immediately. That is, if trigger is asserted at the j-th cycle, then another safe port invocation will be made at the j-th cycle.

Similarly, for fork statements, if any branch of a fork statement does a safe port invocation, the fork statement still spawns threads and synchronizes them as if there were mio safe port invocation at all. However, if there are pending safe port invocations, then the wait that will be executed in the next clock cycle will not be sensitive to its waiting condition until all safe port invocations are finished. Contrast the following two code segments:

```
fork {                      fork {
    a = 1; || foo();            a = 1; safe foo();
}                           }
<stmt1>;                    <stmt1>;
wait (trigger);             wait (trigger);
```

Note that for both fragments, <stmt1> is executed at the same cycle when fork is executed, regardless of the success of the safe port invocation. The wait statement in the code fragment on the left side will be active starting the next clock cycle. However, on the right hand side, the wait statement will not be active until the safe port invocation is finished.

Exceptions

To preempt the execution of a running process, there is a watch construct that immediately interrupts the execution of processes. For example, {<stmt>} watch(<cond>) <watch_stmt>

When the watch clause's corresponding statement ({<stmt>}, the statement the watch clause is affixed to) is active, the clause continuously checks if the watching condition (<cond>) is true. If the condition is not met during the execution of the statement (<stmt>), then the statement simply behaves as if the watch clause does not exist. If the watching condition, however, holds before statement <stmt> is finished, then an exception handling code (<watch_stmt>) will be invoked and the execution of the statement (<stmt>) will be aborted.

```
1  {
2      <stmt1>
3  } watch(kill) { <stmt2>; }
4  <stmt3>;
```

Assume that <stmt1> is executed at the i-th cycle. If signal kill is asserted before <stmt1> is finished, then <stmt2> will be executed (the instant kill is asserted) and control will then be transferred to <stmt3> after <stmt2> is finished. Note that the watch clause becomes active (sensitive to the watching condition) whenever its corresponding statement ({stmt1>}) is being executed.

Watch clauses can be used with wait, while, whenever, { } (sequence of statements), and fork statements. When a watch clause is used with fork statements, all active branches will be preempted when the watching condition is met.

Note that if a statement is sending a message (safe or unsafe) while the outer (enclosing) watching condition is met, the message will not be sent. However, when there is a pending safe port invocation, watch clauses will be disabled (not sensitive to their watching conditions).

Similar to watch clauses, loops (while or whenever) can also have restart clauses. When the restart condition in a restart clause is true, the loop (that is attached to by the restart clause) gets restarted immediately. For example:

```
1  while
2      restart(again) { rerun = 1; }
3      (cond) {
4      wait(fire); go = 1;
5  }
```

Assume that the code stops at line 4, waiting for fire. Suppose that again is asserted, then the loop will be restarted (without setting go to 1) and rerun is set to 1, no matter if fire is asserted or not. Assume that fire is asserted when again is absent, then go is set to 1 (and rerun is not set).

Remember that if a wait statement is executed at the i-th clock cycle, it will not be sensitive to the waiting condition until the i+1-th cycle. However, if wait(w_cond) watch(p_cond) <p_stmt> is executed at the i-th cycle and p_cond is asserted in the same cycle, then the wait statement will be aborted immediately and the statement that follows the wait statement is executed (in cycle i). That is, it will not be waiting for w_cond at the i+1-th cycle at all.

Associated with each watch/restart clause is a fixed priority (the priority decides which exception handling code will be executed and what statement(s) will be aborted) that can be determined statically according to the syntactic structure of the program. In a process, the outer (syntactically) clause has the higher priority. When multiple watch/restart conditions are met, only the clause with the highest priority will be effective.

Assertions

Assertions can be put in objects or channels to monitor the behavior of a piece of code. They are statements that do not correspond to any hardware. They are properties of a hardware that can be checked by simulators or verifiers to help designers validate the design. They also can be used to generate don't care conditions to guide synthesizers to generate compact implementations. Consider again the FSM object discussed above.

```
1  object FSM {
2      latch bit[1:0] state;
3      clock clk;
4      count() @(clk) {
5          if (state < 1) {
6              state = state+1;
7              self.count();
8          }else{
9              state=0;
10         }
11     }
12
13     assert(state <= 1): stateProperty;
14 }
```

The assert statement at line 13 declares an invariance that the designer wishes to be true for the design. stateProperty is the label of the assertion. If the property holds, then the synthesizer can use it to optimize the implementation (e.g., only one bit is necessary for variable state). Unfortunately, the assertion cannot be satisfied by the above design. The violation can be found either by a formal verifier or a simulator. Once the error is flagged, designers can use the error trace to fix the bug.

V++ Examples

In this section, V++ is used to design various hardware components. First, a few circuit components like finite state machines and buses are designed using V++. The next example is Unger's traffic light controller. The last example is the reflex game. It demonstrates the power of processes and preemption constructs.

Finite State Machines

In V++, a FSM can be realized by a port which keeps sending itself messages. For example:

```
1  latch bit [1:0] state;
2  latch bit [1:0] in, out;
3  fsm() @ (clk) {
4      switch (state) {
5          case 0: {state = 3; out = in; }
6          case 1: {state = in; out = 1; }
7          case 2: {state = state; out = in+1; }
8          case 3: {state = 0; out = state;}
9      }
10     fsm();
11 }
```

In the above example, fsm is a port in the containing object (which is not shown). Note that this is an "active" FSM which does a next state computation on each clock cycle. If we want a "passive" FSM, which does nothing until the input stimulus is available, the following code segment is an example:

```
1  latchbit [1:0] state;
2  latchbit [1:0] out;
3  fsm(bit[3:0] in) @ (clk) {
4      switch (state) {
5          case 0: {state = 3; outin; }
6          case 1: {state = in; out = 1; }
7          case 2: {state = state; out = in+1; }
8          case 3: {state = 0; out = state; }
9      }
10 }
```

Contrast this with the previous FSM, the trailing port invocation fsm( ) is removed. The FSM will not do computation unless a message is present. When a new message is available, the fsm port computes the new value of state according to its in argument. On the other hand, the previous FSM samples the value of latch in amid updates to state (its current state) and out on each clock cycle.

Buses

The following example illustrates how a bus can be designed by using user defined channels. It can be used as a multiple-writer, single-reader channel. The channel uses a round robin scheme to schedule multiple requests. Imagine the set of writers are arranged on a ring. The round robin scheduler in the channel dynamically assigns priority to writers in a circular fashion. Once a writer finishes its request, the channel searches along the ring for the next writer which is asserting request and assigns the requesting writer with the highest priority. At each clock cycle, if there is no one requesting for message send then the one that is next to the writer with the highest priority will have the highest priority in the next clock cycle. It is known that such a scheduler is fair. That is, assume that all requests can be finished in bounded time, once a writer asserts its request (and keeps asserting request until it is acknowledged), it will eventually get served.

```
 1  object root {
 2      clock clk;
 3      RoundRobin ci = new RoundRobinO;
 4
 5      sender(bit[3:0] d) @ (clk) {
 6          receiver (d) via ci;
 7      }
 8
 9      receiver(bit[3:0] d) @ (clk) {
10      }
11  }
12
13  channel RoundRobin (clkS, reqS, ackS, dataS)
14                     (clkR, validR, consuineR, dataR) {
15      input clock[] clkS;
16      input bit[] reqS;
17      output bit[] ackS;
18      input bit[] [3:0] dataS;
19
20      input clock[] clkR;
21      output latch bit[] validR;
22      input bit [] consumeR;
23      output bit[] [3:0] dataR;
24
25      latch bit[3:0] id; // the writer with the highest priority
26      latch bit[3:0] q; // the 'FIFO'
27      wire bit[clkS.left+1: clkS.right] [3:0] id1;
28      wire bit[clkS.left+1:clkS.right] [3:0] id2;
29      wire bit [clkS.left+1:clkS.right] found1;
30      wire bit [clkS.left+1:clkS.right] found2;
31      wire bit [clkS.left+1:clkS.right] tokenTaken1;
32      wire bit [clkS.left+1:clkS.right] tokenTaken2;
33      wire bit [clkS.left+1:clkS.right] requesting;
34      wire bit[3:0] new_id;
35      wire bit[3:0] i;
36      run () @ (clkR[0]) {
37          // the two boundary loops first scan for the sender with
             the highest
38          // priority. It then finds the sender with request
             line asserted.
39          id1[0] = 0;
40          found1[0] = 0;
41          tokenTaken1[0] = 0;
42          array(i=clkS.right; i<=clkS.left; i = i + 1) {
43              found1[i + 1] = (i==id) ? 1 : foundl[i];
44              tokenTaken1[i + 1] = (found1[i + 1] & reqS[i] &
                 !tokenTaken1[i]) ?
45                  1 : tokenTakeni [i];
46              id1[i + 1] = (found1[i + 1] & reqS[i] &
                 !tokenTaken1[i]) ? i : id1[i];
```

```
-continued

47      }
48
49      id2[0] = id1[clkS.left+1];
50      tokenTaken2[0] tokenTaken1[clkS.left+1];
51      found2[0] = 1;
52      array(i=clkS.right; i<=clkS.left; ii + 1) {
53          found2[i+1] = (i==id) ? 0 : found2[i];
54          tokenTaken2[i+1] = (found2[i+1] & reqS[i] &
             !tokenTaken2[i]) ?
55              1 : tokenTaken2[i]
56          id2[i+1] = (found2[i+1] & reqS[i] &
             !tokenTaken2[i]) ? i : id2[i];
57      }
58
59      // acknowledgment
60      if (tokenTaken2[clkS.left+1])
61          newid = id2[clkS.left+1];
62      else
63          newid = id+1; // no one is requesting the bus
64      id = new.id;
65      requesting[0] = 0;
66      array (i=clkS.right; i<=clkS.left; i=i+1) {
67          // channel can take inore inputs if:
68          // (1) einpty queue slot available, or
69          // (2) receiver is digesting tokens.
70          if (!validR [0] || consumeR [0]) {
71              ackS[i] = (i == new_id && reqS[i]) ? 1 : 0;
72          }else{
73              ackS[i] = 0;
74          }
75          requesting[i+1] = (i==newid && reqS[i]) ?
76              1 : requesting [i];
77      }
78      // inform receiver that token is available -- valid signal
79      validR[0] = ((validR[0] && !consumeR[0])
                 || requesting[clkS.right]);
80      dataR[0] = q;
81      q = dataS[new_d];
82      }
83  }
```

At line 3, channel RoundRobin is instantiated. At line 6, the port invocation indicates that messages will be delivered via channel instance ci. In channel RoundRobin, id (line 25) is the identifier of the channel that has the highest priority, and variable q (line 26) latches the data to be delivered. The first two array statements (line 42–57) search for the writer that is requesting to send and has the highest priority, line 60–64 determine who will be the one with the highest priority in the next clock cycle. Line 66–77 then signal the writer(s) if their requests have been granted. It also tells the reader if there are valid data available for consumption (line 79–81).

Traffic Light Controller

The code appears below is Unger's traffic light controller. It is a mixture of active and passive FSM shown in Section 2.6.1. The traffic light controller fits the following scenario. There is a highway crossed by a farm road, and the intersection is governed by a traffic light. In general, the light permits traffic on the highway to pass, but when a car arrives at the farm road the light switches to permit traffic to pass along the farm road.

```
1    define(CLOCKYERIOD , Sns)
2    definc(LONGJIMEOUT,12) /* == 60 secs, in 5 ns hunks */
3    define(SHORTJIMEOUT,1) /* == 5 secs, in 5 ns hunks */
4    define(MEDIUM.TIMEOUT,4) /* == 20 secs, in 5 ns hunks */
5
6    define(GREEN,0)
7    define(YELLOW,1)
8    define(RED,2)
```

```
9
10    object TrafficLightController () {
11       private tick() t~(clk) depth(1) destructive {
12          switch (count) {
13             case SHORLTIMEOUT + MEDIUILTIMEOUT:
14                {farmRoadLight[0] = farinRoadLight[1] = YELLOW; }
15             case (2*SHORTJIMEOUT) + MEDIL.ThLTIMEOUT: {
16                farmnRoadLight[0] = farmnRoadLight[1] = RED;
17                highwayLight[0] = highwayLight[1] = GREEN;
18             }
19             case SHORLTIMEOUT: {
20                highwayLight[0] = highwayLight[1] = RED;
21                farmRoadLight[0] = farmRoadLight[1] = GREEN;
22             }
23          }
24-       if      (count != LONGJIMEOUT) {
25             count++;
26             self.tickO;
27          }else{
28                count = 0;
29          }
30       }
31
32       public senseCar() ~(clk && count == 0) depth(1) destructive {
33          highwayLight[0] = highwayLight[1] = YELLOW;
34          self.tickO;
35             }
36          private latch bit[0:31] count=0;
37          public bit [0:1] [1:0] farmRoadLight, highwayLight;
38          public clock clk;
39     }
```

It is apparent to any reader that V++s significantly different from other HDLs. The most significant variant from standard HDL's is that there is no explicit connectivity through arguments and wires. Connectivity is simply given by the port declarations. This implies that the ports are bound to wires in the conventional parameter-like sense of most HDL's: this is because connectivity is largely, though not exclusively, the province of the V++ compiler.

Note also that the ports themselves have significant structures. This is a concept borrowed from object oriented software languages. where messages and methods are identical. Similarly, in V++, ports and messages are indistinguishable: a port defined both a message that may be received and the logic that processes the message. Thus, the port tick (line 11) both defined a message that may be received, and the logic that is executed when the message is received.

When we move to the declaration of tick, we note it is declared private. This of course means that it is invisible to the outside world, and only receives messages sent from the object itself.

Next, we come to the @ clause immediately following the code for the port tick. This clause indicates the conditions that must apply before the message is received. Therefore, tick messages are received whenever clk is true (and, of course, tick messages are pending when clk is false); senseCar messages are received whenever clk is turned on and count is equal to 0.

The immediate question is, what happens to senseCar messages that come in when count is not 0? The answer is that the V++ compiler/linker provide storage to hold them until the guard condition: the argument of the when clause—is true.

The depth(1) destructive modifiers of the tick and senseCar regulate this storage. The depth(1) modifier indicates that the port is only omme-deep: i.e., there is no queue attached to this port. merely a simple latch. Only one message may be stored waiting for receipt. The destructive modifier indicates that the new messages overwrite the old one.

Taken together, these modifier indicate that the port is essentially a place (capable of holding only one token) in a Petri-net; i.e., an incoming message is essentially an enable, which is disabled once serviced.

Reading chronologically, the next curious construct we observe is self.tick( ) (line 26). This is what it appears to be: a message to self on the private port tick. This is in effect an instruction to self to continue the counting process at the next cycle. It is required since the semantics of V++re fundamentally reactive in nature: an object responds to a message by executing the logic on the relevant port for a single cycle, and then is quiescent until the next message arrives.

With this in hand, we can see how the design works. Until a senseCar message arrives, nothing happens. Once senseCar message arrives, the highwayLights are changed to YELLOW and the tic-k port is invoked by a message from senseCar. On the next and succeeding cycles, tick checks count: if it is less than LONG_TIMEOUT (on the first cycle it will be 1), it increments count and sends itself a message to continue; otherwise, it reset count to 0: the object then awaits next message to senseCar.

As can be seen from the example, the message-sending architecture has the side effect that control of a part designed in V++ ends to be distributed. Note, however, that this architecture is not defined by a simulation algorithm. Rather, the guard code, the message delivery and storage structure, and all the code internal to a V++ object, is directly mapped into gates and latches and the mapping is part of the semantics of V++.

Reflex Game

In this section, V++ process constructs are used to design a reflex game machine. The reflex game machine consists of two buttons (ready and stop) and one coin slot (when the player inserts a coin, the variable coin is set to 1). It has a numerical display (a display( ) port, whose definition is not shown in the code below) used to display how fast a player can react, a warning lamp used to signal that the player cheats during a game or abandons the game, a game over lamp to signal the end of game, and a go lamp used to indicate that game machine has started counting. The game machine also has a bell which tells gainers that the wrong button has be pressed.

Initially, the go and warning lights are off, the numerical display is reset, and the game_over light is turned on. After accepting a coin, the machine enters the following sequence:

1. Turn off the game.over lamp.
2. Wait for the user to press ready button.
3. Once the ready button is pressed, it waits for random number of cycles.
4. Turn on go lamp and start a counter measuring how fast the player can react.
5. Wait for the player to press stop.
6. Record/display the player's response time.

The above sequence is repeat NUMBER times and then the average response time is displayed and the game is terminated (the machine goes back to the initial state, waiting for more coins). However, there are a few exceptions that can affect the normal game flow shown above:

At step 2, instead of the ready button, the player presses stop. In this case, a bell is rung signaling that the wrong button has been pressed (exception I).

At step 5, instead of the stop button, ready is pressed. Again, the bell is rung (exception II).

At step 3, the stop button is pressed. The warning light is turned on to warn the player not to cheat (exception III).

The Program

```
1   object reflex {
2       public wire bit go; // 'go' light
3       public wire bit warning; // 'warning' light
4       public wire bit ringEell; // inake soine noise
5       public wire bit gameOver; // 'game.over' lamp
6       public wire bit coin; // the gamer inserts a coin
7       public wire bit ready; // ready button is pressed
8       public wire bit stop; // stop button is pressed
9       private wire bit let Go;
10      latch bit[3:0] totalTime;
11      latch bit [3:0] measureNumber;
12      latch bit[3:0] averageTiine;
13      latch bit[3:0] time;
14      clock clk;
15      reflex() { time.init = 0; timer(); }
16      updateAverage(bit[3:0] time) @(clk) {
17          totalTiine = totalTime + tine;
18          measureNumber = measureNumber + 1;
19          averageTiine = totalTine / mmmeasureNumnber;
20      }
21
22      timer() @(clk) {// the process is only invoked
            in the constructor.
23          time = time + 1;
24          timer();
25      }
26
27      signalGo (bit[3:0] pausePeriod) @(clk) {
28          if (pausePeriod == 0) letGo = 1;
29          else signalGo(pausePeriod-1);
30      }
31
32      wire bit[3:0] i;
33      process reflexGame() @(clk) {
34          totalTime = 0; measureNumber = 0; averageTime = 0;
35          go = 0; warning = 0; gameOver = 1; display(0);
36          whenever
37          restart (coin) {}
38          (coin) {
39              go = 0; warning = 0; gameOver = 1; display(0);
40              totalTime = 0; mneasureNumber = 0;
41              array (i0; i<NUMBER; ii+1) {
42                  // wait for the gamer to signal ready
43                  whenever
44                      watch (ready) {}
45                      (stop) { ringBell = 1; } // exception I
46                  signalGo(randoinG1);
47                  // ready-set-go
48                  whenever
49                      watch (letGo) { go = 1; }
50                      restart (stop) { warning = 1; } // exception III
51                      (ready) { ringBell = 1; }
52                  // now see how fast can the gamer react
53                  time = 0;
54                  whenever
55                      watch (stop) {
56                          display(tiine); updateAverage(tiine); go = 0;
57                      }
58                      (ready) { ringBell = 1; } II exception II
59              }
60              display(averageTiine);
61          }
62      }
63      priority reflexGame > updateAverage;
64      priority reflexGame > tuner;
65      priority reflexGame > signalGo;
66  }
```

The constructor at line 15 starts the tuner port, which is a counter. The main body of the reflex game machine starts at line 33. It first initializes various timer variables (totalTime, mneasureNumber, and averageTime) amid turns on/off appropriate status lights. The machine then waits for a gamner to insert a coin. When a coin is inserted, the game machine first waits for the gamer to press the ready button. Once the ready button is pressed, the game machine then invokes a timer (signalGo port at line 27) which counts up to a random upper-bound. randon( ) (line 46) is a function which returns positive random numbers. The definition of this function is not shown in the above example. Port signalGo "wakes" reflexGame up by setting signal letGo, which preempts the whenever statement at line 48. In addition, when the whenever statement (line 48) is aborted, the go light is lit. Now the game machine waits the gamer to push the stop button. Then it shows how long it takes the gamer to respond to the go signal (line 56). At the end of the game, the machine shows the average response time (line 60). At line 37, the restart clause states that, if a coin is inserted in the middle of a game, a new game will be started immediately.

Compilation, Synthesis, and Simulation of V++

This section discusses compiling and linking V++ programs. The overall compilation/link process is illustrated in FIG. 7. The input program is first parsed and transformed into a set of graphs, namely the parse trees, the precedence graphs, and the nested control flow graphs. Based on the precedence graphs, the compiler determines the resolution function for each variable. Based on the NCFGs, the circuitry for the V++ program are generated. The result of the compilation process is a set of intermediate representations which are then taken by the linker. The intermediate representations contain circuits that have been generated (e.g., the data-paths whose widths are known), the parameterized logic whose parameter cannot be determined yet, and the "holes" that need to be patched by the linker (e.g., references to ports of another object). The linker then builds a instantiation graph according to the instantiation hierarchy in the source program and evaluates the constructors and generators to determine the values of parameters for objects as well as the interconnections among objects. The V++ linker patch the definition holes for object references. Note that, unlike programming language linkers, the V++ linker is also responsible for generating logic. To be more specific, the V++ linker has to generate logic in channels.

This chapter is organized as follows. First a simple example (Fibonacci sequence generator) is given to demonstrate what circuits are generated for different V++ constructs. Then the process and algorithms for compilation are presented. Following that we describe what tasks are required in linking together compiled objects. Then some optimization techniques for synthesizing circuits from V++ programs are given. Following that scheduling V++ objects for simulation in a design is explained.

Compiling V++ Programs

Figure 8:
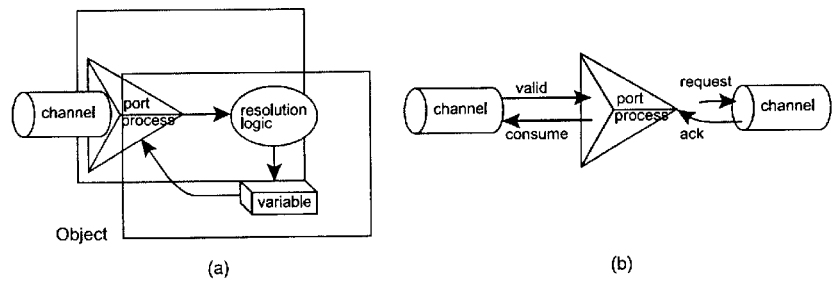
FIGS. 8a and 8b illustrate the structure of generated circuits for V++ programs.

Conceptually, the V++ compiler generates circuits with the structure shown in FIG. 8a. For the body of each port or process, logic is created. If a port touches a variable, a resolution circuit will be generated to determine if the port can change the value of the variable. Similarly, if a port invokes another port, a communication device (channel) will be synthesized to arbitrate among multiple port invocations to the same destination. The channel is also responsible for sampling the arguments to the invoked port. For each port/process, there is exactly one channel that can deliver data to it.

Ports and channels communicate with each other via a fixed set of control and data wires. The data wires carry the arguments the invoking process is trying to send to the invoked process. The control wires, namely request, acknowledgment (it is also referred to as ack), valid, and consume, are used to synchronize channels and ports. These control wires are shown in FIG. 8a. The logic in a port/process continuously monitors the channel logic that is responsible for delivering data for the port/process by checking the valid bit. If the valid bit of the channel is set, the port/process evaluates the logic of the port/process body. As soon as the statement body of the invoked port gets executed, the port/process then asserts consume signal to notify the channel that the arguments have been digested. If there are FIFO's in the channel (a FIFO is always allocated in the compiler generated channel) for latching arguments, consume can be used to advance the FIFO pointer.

If a port invokes another port, then the request bit to the delivering channel will be asserted and the arguments provided to the channel. If the channel has enough capacity to deal with the request, it latches the arguments and asserts acknowledgment at the next clock cycle. Otherwise the acknowledgment line is kept low. If the invoking port/process is doing safe port invocation, it needs to inquiry this signal in order to determine if it can do more computation, or it has to halt itself and keep trying the safe send.

The resolution logic then takes the contending assignments from different ports/processes that are executed and change the values of the variables. If the variable is a latch, the new value will be effective in the next clock cycle. If the variable is a wire, then the effect will be visible immediately.

Figure 9:
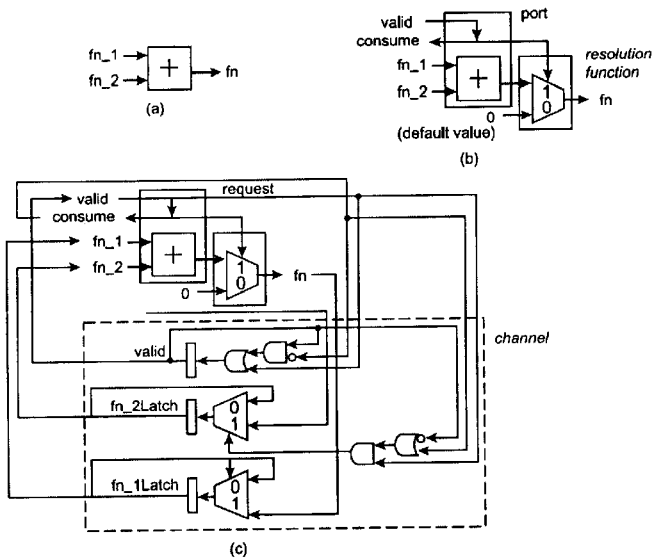
FIGS. 9a, 9b, and 9c illustrate a Fibonacci sequence generator.

The following examples highlight the process how circuits are synthesized by the V++ compiler/linker. Assume that fn, fn__1, and fn__2 are all 4-bit vectors. Given the following V++ segment, fn=fn__1+fn__2;

Then the most straightforward translation is an adder with fn__1 and fn__2 as its inputs and fn as its output (FIG. 9a). Assume that the assignment is enclosed in a port f:

wire bit[3:0] fn;

f (bit[3:0] fn__1, bit[3:0] fn__2) @(clk) depth(1) {fn=fn__1+fn__2;}

The circuit for the above code is shown in FIG. 9b. There are two compiler generated wires allocated for f. The valid bit is set by the channel circuit to indicate that there is a fresh copy of fn__1 and fn__2 for f. This signal is also used to determine if the output of the adder will be used as the new value of fn. f uses consume to indicate if fn__and fn__2 have been used.

Assume that, in the port body statement, what follows the assignment is a port invocation of f:

f(bit[3:0] fn$_{13}$ 1, bit[3:O] fn__2) @(clk) depth (1) {fn= fn__1+fn__2; f(fn, fn__1);}

The channel circuitry that will be created by the linker is shown in FIG. 9c. In the channel, two sets of latches (fn__1Latch and fn__2Latch) are generated for arguments fn__1 and fn__2 of f. The latches are enabled under the conditions (1) f is trying to send a message (request is asserted), and (2) current content of the argument latches will be invalid ("stale") in the next clock cycle (consume is asserted or valid is not asserted). Note that as the port invocation is not a safe port invocation, no ack signal will be generated. The valid bit in the channel is set when (1) f is trying to send a message through the message (by asserting request line), or (2) the current value of valid latch is one and f has not consumed its arguments yet (consume is held low).

The above port can be extended to generate Fibonacci numbers. The Fibonacci sequence generator looks like:

```
1  object fibonacci {
2  public wire bit[3:0] fn;
3  clock clk;
4  fibonacci() { f(1,1); }
5  f(bit[3:0] fn__1, bit[3:0] fn__2) @(clk) depth(1) {
6      fn = fn__1 + fn__2;
7      f(fn, fn__1);
8  }
9  }
```

The constructor at line 4 does a initial port invocation to f This initial invocation instructs the V++ linker to set the valid latch in the channel to 1. In addition fn__1Latch and fn__2Latch are both initialized to 1.

Compiling V++ Ports and Processes

"Pins" for Ports/Processes

Given a port/process, logic will be generated by the compiler. Conceptually, this logic has the I/O pins for request, acknowledge, valid, consume, receive (argument), send (argument) and running.

The valid signal comes from the channel that carries the arguments to the port. The consume bit, computed by the port/process, indicates if the argument has been taken by the port/process so that the channel can discard it. <rcv-arg>* is a list of data wires that are used as the arguments for the port/process. Whenever the port/process makes a port invocation, a set of (req, ack, <send-arg>*) signals are allocated. These signals will be glued to the channel that is responsible of carrying the arguments to the invoked port/process. req is asserted by the sending port/process indicating that it intends to invoke a certain port. <send-arg>* are the data to be delivered. ack, computed by the delivering channel, indicates if the channel has a chance to sample <send-arg>*. If the invoking port is doing a safe port invocation, the signal is used to block its execution.

The output pin running, computed by the port/process, indicates if the port/process is performing computation/port-invocation. If a port/process is making a safe port invocation and it is blocked, then this pin is set to low.

Kernel V++ Port/Process Constructs

To compile a V++ port/process, the V++ compiler needs to analyze the interaction among different constructs. For example, given the V++ fragment {<statement>} watch (c), the generated circuit should be able to instantaneously abort the execution of <statement> whenever c is asserted. However, when c is asserted, <statement> might be executing its sub-statements. Therefore, watch(c) not only needs to abort the execution of sub-statements of <statement>, it also needs to change the execution flow so that the statement following watch(c) will get executed. That is, when the V++ compiler is compiling <statement> and its sub-statements, it should be aware that they can be preempted by signal c.

The V++ Hardware Design Language has a rich set of constructs. Analyzing the interaction among all V++ constructs will be complicated, tedious, and error-prone. To simplify the compilation process, a small set of kernel constructs is introduced. The kernel constructs are carefully chosen so that the V++ constructs can be described as combinations of the kernel constructs. Note that not all these kernel constructs are directly available in the V++ language. These kernel constructs are given in FIG. 10.

In addition to the constructs listed in FIG. 10, the kernel constructs provide all the operators available in the V++ language. Therefore, the translation of V++ expressions into kernel is simply making duplicates. The kernel constructs can be classified into two groups: the control flow constructs and the data flow constructs. The control flow constructs (wait, label, branch, serial composition, and parallel composition) are used to change the execution flow of V++ ports/processes. On the other hand, data flow constructs (assignment, default port invocation, and safe port invocation) are used to modify the values of variables or send messages to other ports/processes.

The wait construct (@(<expr>)) halts the execution of a port/process until <expr> becomes true. A wait statement takes at least one clock cycle to execute. That is, the time @(<expr>) is executed (at cycle i), it is not sensitive to <expr>. It can be sensitive to <expr> only in the cycles that follow cycle i. Wait statement is the only kernel construct that explicitly introduces delays.

The label construct does nothing but put a symbolic label so that a branch construct can "jump to". The branch (<expr>) <label> chooses either the statement that immediately follows it (when <expr> is false) or the statement that immediately follows <label>: (when <expr> is true) for execution, depending on the outcome of <expr>.

The two constructs { } and fork/join are called composite statements as they group a set of statements (separated by; and | |, respectively). The curry braces group a set of statements "sequentially" (separated by semicolons). That is, suppose that {<stmt1>; @(<expr1>); <stmt2>} is selected for execution at the i-th cycle, then <stmt1> is executed at the i-th cycle, then it waits for <expr1> to become true from the i+1-th cycle. When <expr1> turns true, <stmt2> can be executed at the very cycle.

fork/join groups a set of statement "concurrently" (separated by | |). The statements that are separated by | | are called the branches of the corresponding fork/join statement. A fork/join statement spawns a set of concurrent, independent branches which will be synchronized when they are finished. The synchronization takes zero time. That is, as soon the slowest branch of the fork/join statement finishes, the fork/join statement finishes (at the same instant).

Note that the kernel fork/join construct is different from the fork statement of the V++ language in that a kernel fork/join statement has an additional weak preempting expression following the fork/join keyword. A fork/join statement like fork <stmt1> | | . . . | | <stmtn> join (<preempt_expr>) can be "weakly" preempted when the expression <preempt_expr> is asserted. The function of the weak preempting expression is to abort the fork/join statement even if it is still waiting for some of its branches to finish. The statement following the fork/join statement can then immediately starts execution. However, the execution of the unfinished branches is not affected by the weak preempting expression. Later, when these unfinished branches finish execution, the fork/join statement will simply ignores their completion.

Note the difference between fork/join and { }. Suppose that all the statements grouped by the two composite constructs contain no wait statement, then the two statements behave the same. However, suppose that the statements contain wait statement(s), then different branches in the fork/join statement will get executed independently. That is, suppose-that one branch is locked in one of its wait statement(s), execution in other branches will not be affected. However, in a block of sequential composite statement, if the statement that precedes (in syntactic order) is locked in its wait statement(s), then the statements that follow will be excluded from execution (at current clock cycle).

The assignment <lhs>=<rhs> changes the value of a variable. When an assignment is executed, a new value (result of <rhs>) is suggested as the new value of the <lhs> variable. The actual new value of the variable will be determined by a compiler generated resolution logic.

The port invocation (<id> ( <expr_list>)), when executed, sends a message to port <id> via an appropriate channel. If the channel does not have enough capacity to deliver the message at the very cycle, then the message will get lost. The safe port invocation (safe<id>(<expr_list>)) has the same functionality except that if the message send does not go through, the execution of the sending party will be blocked until the channel has a chance to sample the data to be sent (<expr_list>).

The label, branch, sequential composition, parallel composition, and wait constructs define the control structures of ports/processes. The assignment, port invocation, and safe port invocation constructs define the data-paths of ports/processes. Based on the values of conditional expressions in a port/process, the control structure of the port/process picks up the data-paths that can be executed. Intuitively, one can imagine a port/process operates in the following fashion. At the beginning of each clock cycle, a process is sleeping at one (or more) of its wait statements (it will be called the source wait statement), waiting for specific expressions to become true. When the expressions turn true, the port/process searches, along the control structure of the port/process, for a set of wait statements (referred to as the destination wait statements) where the control of the port/process can stay and wait for new conditions in the next clock cycle. All the data-paths on the paths, selected by conditional expressions, between source wait statement and the destination wait statement are executed simultaneously.

Representation of V++ Ports/Processes

To represent the abstract control structure of V++ ports/processes, Nested Control Flow Graphs (NCFGs) are introduced in this section. Similar to control flow graphs in traditional programming language compilers, NCFGs makes the transfer of control explicit. Unlike software control flow graphs, in NCFGs, all statements in serial (without intervening wait statement) are executed simultaneously. The syntactic order among these statements does not suggest any data dependency (whether it is true data dependency. anti-dependency, or output dependency). Dependencies are introduced only by variable references. That is, read from wire variables always refer to the values that have been assigned in the same cycle. Read from latch variables always refer to their present states while all writes to latch variables can only affect their next states (the new values of the latches in the next clock cycle).

A nested control flow graph (NCFG) is a multi-graph $G=(V, E)$ where V is the set of nodes and E is the set of arcs. Associated with vertex v V is its kind, denoted by $\kappa(v)$, $\kappa$: $V \rightarrow$ {wait, dummy, branch, serial, parallel, assignment, send, safe-send } for construct wait, label, conditional branch, serial composition, parallel composition, assignment, default port invocation, and safe port invocation, respectively. We will also exchangeably use $v \in V$ and the corresponding construct/statement in the source V++ ports/processes if it does riot cause confusion.

To construct a NCFG for a V++ port/process, each construct is allocated a distinct vertex. In addition, there is a directed arc $e \in E$, $e: v_1 \rightarrow v_2$ iff 1. $v_1$ and $v_2$ are separated by; and $v_1$ precedes $v_2$ syntactically, or 2. $v_1$ is a conditional branch with $v_2$ as its target label. Note that if $\kappa(v_1)$==branch, a label is associated with e, denoted by l(e), which is defined as:

$$l(e) = \begin{cases} f & \text{if } e \text{ is introduced by rule 1 above} \\ t & \text{if } e \text{ is introduced by rule 2 above} \end{cases}$$

If v∈V is a sequential composition, then it contains an NCFG G' for its sub-statements as one of its attributes, denoted by $\gamma(v)=\{G'\}$. If v∈V is a parallel composition, then it also contains a set of NCFGs, denoted by $\gamma(v)$. It is the set $\{G'|G'$ is the NCFG of s, s is a branch of v$\}$.

The Control Flow Graph of a port/process can be derived from its NCFG by recursively expanding its composite (serial or parallel) vertices in the following way until there are no composite vertices.

1. If vertex v is a serial composite vertex. Assume that $\alpha$ is the first vertex in $\gamma(v)$ and $\beta$ is the last vertex in $\gamma(v)$, replace each edge u→v with u→$\alpha$ and v→u with $\beta$→u.

2. If vertex v is a parallel composite vertex. For each branch NCFG G'∈$\gamma(v)$, assuming that $\alpha$ is the first vertex in G' and $\beta$ the last vertex in G', replace each edge u→v with u→$\alpha$ and v→u with $\beta$→u.

FIG. 11 illustrates a sample kernel code segment, its NCFG, and the CFG. Note that the fork/join vertex in the NCFG contains two sub-NCFGs, one for each of its branches.

Compiling V++ Port/Process Constructs

To compile a V++ port/process, the port/process constructs are first transformed into kernel constructs. Then the NCFG for the transformed code segment is built. Circuits are then generated from the NCFGs. In this section, we show how to build circuits from kernel constructs. The details of compiling V++ constructs into kernel are given.

Building Circuits from NCFGs

Given an NCFG of a kernel program, the synthesized circuit contains three major parts—the control net, the block net, and the data path. Their interaction is shown in FIG. 12. Both control and block nets are structurally translated from the NCFG. The data path is directly translated from the data flow constructs in the port/process. The control net is used to determine which data-path operators will be active and which port to invoke. The block net checks if there is a pending safe send executed before destination wait statement is executed (by looking at the ack signals returned from the channels that are responsible for delivering outgoing safe messages). If that is the case, then block net will prevent the destination statement from being sensitive to the waiting condition until the safe sends get finished.

At each clock cycle, the block net first computes, from the ack signals from safe send channels, if the destination wait statement can be activated (sensitive to its conditional expression). If there are still unfinished safe sends, then the wait statement will not be active. Otherwise, it will start busy waiting. When the condition expression of an active wait statement turns true, the control net will choose, according to the syntactic structure of the program, the set of data-path components that will be active (change the values of variables or assert request signal for sending messages). In the meantime, control net also finds the set of destination wait statements that the port/process will stay and wait for new conditions in the following cycles.

FIG. 13 shows the algorithm for building circuits from a NCFG. Before we go into the details of how the algorithm works, we first examine the routines that are used by the algorithm. Conceptually, compilation of expressions (generation of data-paths) is the most straightforward task. Basically, all we need to do is to build the dataflow graph according to the parse tree of an expression. For each expression, its sub-expressions are first compiled into circuits. The outputs from these circuits are treated as the results of sub-expression compilation. The operator of the expression is then built with the results from the sub-expression compilation as the inputs. The output of the circuit for the operator is then treated as the output/result of the expression compilation. For example, to compile statement s, foo=a+b, the sub-expressions a and b are first compiled, then the outputs (the wires carrying the values of a and b) are fed into an adder (the result of compiling +) and the output of the adder is taken as the result of compiling s, denoted by Data-Path(s).

Circuits that are generated by routine ControlNode (vertex_type) follow a standard I/O pin definition as shown in the following figure. These circuits are called the control nodes.

The functionality of each pin is:

The output pin sel (in case vertex_type is branch, there are two separate pins, sel_t and sel_f instead of sel) indicates that the following statement will be chosen for execution in the current clock cycle.

The input pin act indicates that the statement is chosen to be executed.

The input cond carries a Boolean value. If the vertex_type is wait, the pin denotes the condition the statement is waiting for. If vertex_type is branch, the cond pin determines which branch will get executed. If vertex_type is parallel-composite, the pin determines if the statement should get aborted immediately. The input blk is used to indicate if the safe sends executed before the statement have been finished.

Circuits that are generated by routine BlockNode (vertex_type) following a standard I/O pin definition as shown in the following figure. These circuits are call the block nodes.

The functionality of each pin is:

The output pin blk_o indicates that there is at least one pending safe port invocation to be finished after the current vertex is executed. (If vertex_type is branch, there are two separate pins blk_o_t and blk_o_f, instead of blk_o, blk_o_t and blk_o_f are identical outputs.)

The input pin blk_i indicates that there is one (or more) pending safe port invocation to be finished before the current vertex is executed.

The output pin blk_local are used only if vertex_type is wait. The pin carries a Boolean value. It indicates if the safe sends preceding the wait statement are pending. It is used to control if the wait statement can be sensitive to the waiting condition. A wait statement, even though it is selected as the destination wait statement, cannot be sensitive to the waiting condition if there are pending safe sends executed before the wait statement.

The algorithm in FIG. 13 can be used to structurally, recursively build control nets, block nets, and data-paths from a NCFG G. Depending on the kind of a vertex in G, it allocates predefined circuit templates in the control net, block net, and data-path for that vertex. The following subsection details the template building routines ControlNode ( ), BlockNode ( ), and Data-Path ( ) for each kind of vertex. The allocated circuit nodes are then wired together according to the edges in G. In the control net and block net, if there are more than one wire connecting to the input pin of a control node, all the wires are wired-or together. The above process is recursively applied to all the composite vertices in the NCFG.

Next, we show how to synthesize circuits for each type of vertex.

Wait Vertex

Figure 14:
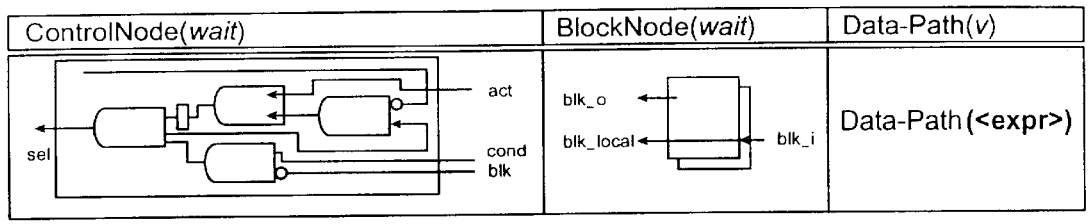
FIG. 14 illustrates a control node, a block node, and a data path.

Given a NCFG node v for a wait statement @ (<expr>), the circuits shown in FIG. 14 are allocated for the control net, block net, and data path. In the control node, the small rectangle in the middle is a latch controlled by the clock of the port/process. When the wait statement is not busy waiting for cond, the latch holds 0. Once the wait statement becomes the destination wait statement, the latch is loaded. From that point, it waits cond to turn true. Once the waiting condition expression becomes true and blk pin is false (i.e., there is no pending safe port invocation), the sel output pin is asserted arid the latch will be discharged at the next cycle.

The circuit in the block node is simply a wire from blk__i to blk__local, indicating that if there is a pending safe port invocation, then the wait statement is not sensitive to conditional expression of the wait statement (remember that blk__local of the block net is glued with blk pin of the control net). In addition, blk__o is glued to zero, saying that when the statement following the wait statement is executed, there is no pending safe port invocation yet.

The cond pin of the control node is connected to the output of Data-Path(<expr>).

Dunmmy Vertex

The circuits that are synthesized for dummy vertices are simple. The act pin of the control node is wired to the sel pin. That is, if the dummy vertex is chosen for execution, then the vertex following the dummy vertex will also be chosen. The cond pin of a dummy vertex is left open and the blk pin is not used. The blk__i pin of the block node is wired to the blk__o pin. That is, the vertex does not affect the Boolean flag which indicates whether there is a pending safe port invocation. The blk__local wire of the block node is left undriven. No data-path logic is generated for a dummy vertex.

Branch Vertex

Given a NCFG node v for a branch statement branch (<expr>) <label>, the circuit nodes are generated. In the control node, based on the result of <expr>, it chooses one of the branches (sel__t or sel__f) for execution. The blk input to the control node is not used. In the block node, blk__i is connected to both blk__o__t and blk__o__f indicating that if there is a pending safe port invocation executed before the branch vertex, then both branches will know of the pending port invocation. The blk__local is left open. For branch vertex, the output the Data-Path (<expr>) is wired to the cond pin of the control node.

Serial-Composition Vertex

Figure 15:
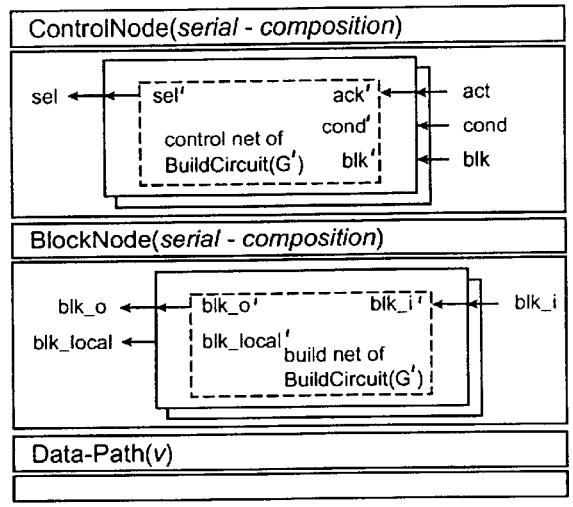
FIG. 15 illustrates a serial composition vertex.

To compile a serial composition vertex v, the NCFG C' that is contained in γ(v) is first compiled. As shown in FIG. 15, the compiled control and block nets for G' (shown in dotted rectangle) are then glued with the pins of the control and block nodes for v. In the control net, the act pin of the control node of v is connected with the corresponding pin (act') of the control node of the first vertex of G'. The sel pin for v is wired to the sel output (denoted by sel' in the figure) of the control node of the last vertex in G'.

Similarly, in the block net, the blk__i, blk__o pins of the block node for v are connected to the blk__i pin (denoted by blk__i') of the first vertex and blk__o pin (denoted by blk__o') of the last vertex in G', respectively. The blk__local pin is left open. There is no data-path logic generated for a serial composition.

Parallel-Composition Vertex

Figure 16:
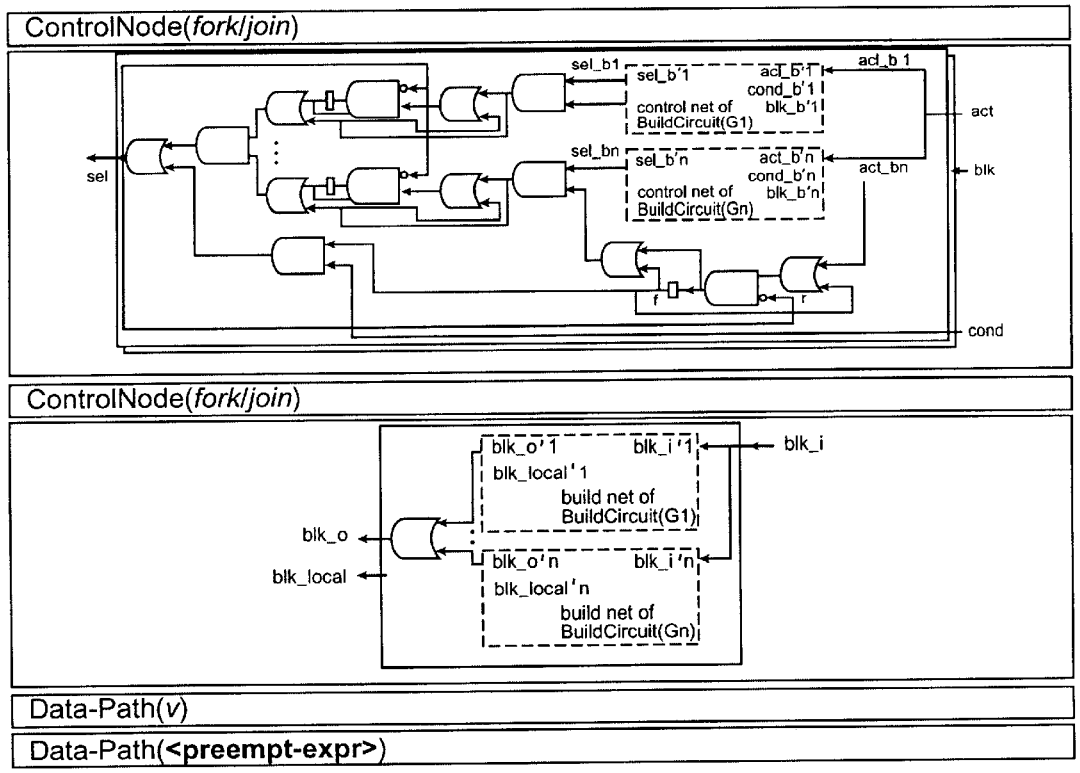
FIG. 16 illustrates a parallel composition vertex.

Given a NCFG parallel composite vertex v for a kernel construct fork <stmt1> || . . . || <stmtn> join (<preempt__expr>),the circuit shown in FIG. 16 is synthesized. In the control net, one latch is allocated for each branch to memorize the fact that the branch has finished. That is, if a branch finishes execution, the latch for the branch get charged. The latch is discharged when the fork/join statement finishes execution (the instant when all branches are done).

Note that there is another latch labeled f that is allocated for a fork/join statement. The purpose of the latch is to point out if the fork/join is still active (that is, some of its branches have not finished execution yet).

The cond pin-of the control node is used to abort the execution of the fork/join statement. In other word, it is used to force the fork/join statement to hand over the control of program execution to the statement following the fork/join statement. However, does not influence the execution of the branches.

Each branch of the fork/join statement is recursively compiled and connected to the control/block node of the fork/join statement as shown in the FIG. 16. Let $G_i$ denote the NCFG of the i-th branch of v. In the control node, the act pin of the control node of the first vertex in $G_i$ (denoted by $act\_b'_i$) is wired with $act\_b_i$. The sel pin of the control node of the last vertex in $G_i$ (denoted by $sel\_b'_i$) is wired with $sel\_b_i$. Similarly, in the block node, the blk__i pin of the block node of the first vertex in $G_i$ (denoted by $blk\_i'_i$) is wired with blk__i. The blk__o pin of the block node of the last vertex in $G_i$ (denoted by $blk\_o'_i$) feeds an or gate. The output of the or gate is glued with the blk__o pin of the block node.

The output of Data-Path(<preempt__expr>) is connected to the cond pin of the control node for the fork/join statement.

Assignment Vertex

For an assignment <lhs>=<rhs>, the control and block nodes are generated the same way nodes are generated for dummy vertices. Regarding data-path, what is generated for an assignment is a multiplexer choosing the default value for the LHS (left-hand-side) variable or the output of Data-Path (rhs). The control input to the multiplexer is derived from the act input pin of the control node. The outputs of these multiplexers are then collected by the compiler generated resolution logic to determine the values of variables.

Basically, the V++ compiler forms a priority graph (a directed graph) according to the priority statements in the V++ program. The graph is then topologically sorted to get a-linearized priority list. According to the priority list, the V++ compiler can then generate resolution logic (or priority decoder) to resolve multiple assignments from multiple ports/processes to the same variable.

Port-Invocation Vertex

To send a message (<id>(<el>, . . . <en>)), the data-paths for all the argument expressions are first generated. Outputs of these expressions are then wired with the channel that is responsible for delivering the message. The act pin of the control node is glued to the request pin of the channel. In the control node and block node, similar to the dummy vertex, the act pin of the control node is wired to the sel pin, the blk__i input of the block node is connected to the blk__o pin.

Self-Port-Invocation Vertex

Figure 17:
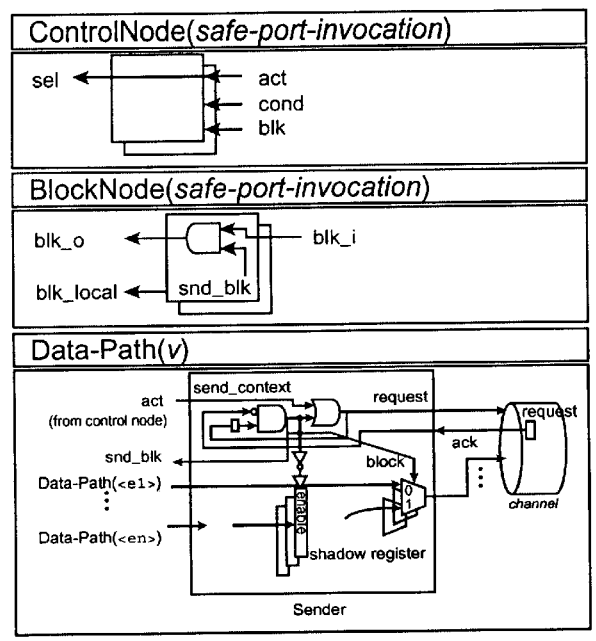
FIG. 17 illustrates a safe port invocation vertex.

The circuits that are generated for safe port invocation are shown in FIG. 17.

In the data-path for a safe-port-invocation vertex, similar to port-invocation vertex, the data-paths for all the argument expressions are first compiled. In addition, a set of shadow registers are allocated to hold the arguments in case ack does not come back in the next clock cycle after the safe port invocation has been made (that is, the channel that is responsible for delivering the message cannot sample the data to be sent in time). The data-path computes a snd_blk signal which indicates if the port invocation has been suspended. If that is the case, then the shadow register(s) stops loading new data. In addition, the req is kept high signaling the channel that the port invocation is pending.

In the block node, the snd_blk signal computed by the data-path is ored with the blk_i pin, and the result is glued to blk_o. In the control node, the act signal from the control node is glued with the act pin of the data path indicating if the statement is selected for execution.

Legal Processes

Before we describe the details of compiling V++ constructs into kernel constructs, we should note that not all combinations of V++ constructs (or kernel constructs) have a good interpretation in terms of hardware. For example, assuming that a is a latch variable, consider the following code segment:

1 lab:;
2 a=a+b;
3 branch (a==8) lab;

The code is essentially a loop which adds b to a until it is greater than 8. Moreover, all iterations should be done in the same clock cycle. If such programs were allowed, then to synthesize hardware for the code segment, one needs to find out, in the worst case, the number of times the loop body (line 3) will be executed. To achieve this, one needs to do reachability analysis, which is awfully expensive, if not unsolvable, for a V++ program.

Even worse, one can even have programs that does not have well-defined behavior. For example, assume that a is a wire:

1 lab:;
2 a=!a;
3 branch (1) lab;

Obviously, there is no valuation of a that will satisfy the above program.

Therefore, a simple restriction is imposed on the allowed forms of kernel programs. The restriction is that, for each cycle in the CFG of a port/process, there should be at least one wait statement on the cycle. A NCFG/CFG that satisfies such a condition is called legal. If a program whose NCFGs/CFGs are all legal, then the program is legal. Whether a NCFG/CFG is legal or not can be checked by a graph traversal. Given a CFG G=(V, E), the algorithm in FIG. 18 checks whether a CFG is legal.

Compiling V++ Process Constructs into Kernel Constructs

To compile ports/processes, an intermediate construct is introduced. The intermediate construct, [<cond>:<handle>] (which is neither a kernel construct nor a V++ construct), can be regarded as a variation of the watch (preemption) clause. A statement like <stmt> [<cond>:<handle>] means that, when <stmt> is waiting, the execution can be preempted by asserting condition <cond>. That is, if <cond> is asserted when <stmt> is waiting for a certain events, <stmt> is immediate "waken-up" and <handle> (the handler) is executed. If <handle> does not transfer flow of control to other place (by using branch), then <stmt> resumes execution right after the statement which just gets interrupted.

The differences between watch clause and [ ] are:
1. watch clauses can only be attached to wait statement, loop statements (while or whenever statements) or composite statements (fork/join or { }). [ ] clauses can be attached to any statement (even though they may have no effects on the statement),
2. watch can affect "delay-less" statements. In addition, it aborts the statement once the preemption condition occurs.

[ ] only searches for buried @ statements and insert the preemption condition and handler to influence the execution of these @ statements. That is, when the preemption condition occurs, if the handler does not transfer control to other places, the port/process will resume execution right after the preempted @ statement.

We now show how V++ constructs are compiled into kernel constructs. In the following translation rules, all V++ constructs are in italic, all kernel constructs are in typewriter type style.

Compiling Wait Statements wait-statements are simply compiled to the @ kernel construct according to the first rule in FIG. 19. The second rule compiles a wait statement with a watch clause.

The third rule states that a @ statement that is preempted by condition <d> is translated into a @ statement which is not only sensitive to <cond>, but also <d>. The exception handler will be the first statement to be executed when the @ statement sees <d>. In the rule, <label_done> is a compiler-generated label that each wait statement has a unique <label_done>. The second branch statement in the rule seems to be redundant. It is needed, however, to ensure the correctness of translation for @ statements that are preempted by multiple preemption clauses.

Compiling Basic Statements

The compilation rules for basic statements (assignments, port invocations, and safe port invocations) are listed in FIG. 20. The first three rules show a compilation from V++ constructs to kernel constructs. Rules 4–7 show how preempted basic kernel statements (label, assignment, port-invocation, and safe-port-invocation) are compiled. They indicate that the preemption clause has no effect on data-path elements. Basically, preempt conditions only have effect on control constructs.

Compiling Conditional Statements

FIG. 21 shows how conditional statements (if/else statements or switch statements) are compiled. The labels <label_done> and <label_else> are compiler-generated labels that are unique for each if/else statement.

Rules 1–2 compile if/else statements into branch kernel constructs. Rules 3–4 deal with switch statements. Instead of compiling switch statements directly into kernel construct, they are first translated into if/else statements in V++.

Rule 5 indicates that the preemption clause has no effects on branch construct.

Compiling Loop Statements

The loop constructs (while statements and whenever statements) are compiled according to the rules in FIG. 22. Note that when a whenever loop is entered, it will not be voluntarily broken out unless preempted by watch clauses. On the other hand, a while loop will be (re)entered only when its conditional expression is true.

In these rules, <label_loop> and <label_exit> are compiler-generated labels which denote the re-entrant and exit points for a loop statement, respectively. <label_loop> and <label_exit> are unique for each loop statement. If there are more than one watch/restart clauses in a while/whenever statement, then they all refer to the same <label_loop> and <label_exit> labels. The watch and restart clauses of a loop statement will be processed according to their syntactic order. That is, the "innermost" clause (the clause that is closest to the loop construct) will be processed first and the "outermost" clause will have the highest priority. FIG. 22 shows how to compile break and continue statements. To compile break (continue), one simply replaces the statement with branch(1) <label_exit> (branch (1) <label_loop>), where <label_exit> (<label_loop>) is the compiler-generated label for the corresponding loop statement.

Compiling Composite Statements

FIG. 23 lists the compilation rules for composite statements (parallel composition; fork/join, and sequential composition, { }). The first three rules compile fork statements into kernel fork/join constructs. If a fork/join construct is preempted by more than one condition, the first one (the one that is closest to the fork/join construct) is compiled first and the last one has the highest priority.

Time labels <label_exit> and <label_done> in the third and sixth rule are compiler-generated labels that are unique for each fork/sequential statement.

Compiling Ports/Processes

A port/process is translated into a while loop which is sensitive to the conjunction of the guarding condition of the port/process, the valid signal coming from the channel that is responsible for carrying the incoming arguments, and signal block (which is the blk_o pin of the block node of the last vertex in the NCFG of the port/process's body statement). FIG. 24 shows the translation rule.

The clk signal in FIG. 24 is used as the controlling clock of the wait statement of the translated code. Whenever <stmt> refers to the variables in <args>, it will be redirected to the data pins of the channel that is responsible for delivering data to port <id>.

Synthesizing Resolution Functions

Once ports/processes are compiled, resolution logic are generated to resolve conflicting assignments from multiple ports/processes. Basically, every variable either defaults to a combinational value (wire) or its previous value (latch). Resolution functions are used to prioritize among assignments and determine the final result of the variable. The priority keywords specify the priorities of ports/processes in terms of their ability in influencing the values of variables. The logic generated for resolution functions are essentially priority decoders (a series of multiplexers) built from the precedence graphs constructed in the following way.

For each variable $\alpha$, a precedence graph (a directed graph) $P_\alpha=(V_\alpha, E_\alpha)$ is introduced. For each port that assigns to $\alpha$, a vertex is allocated in $V_\alpha$. In addition, the partial order among ports that is introduced by priority statement is translated into a set of edges in $P_\alpha$. That is, for each $p_i<p_j$ in the priority statement, an edge from $p_j$ to $p_i$ is added to $E_\alpha$ if both $p_i$ and $p_j$ access $\alpha$.

After the precedence graph is formed (the precedence graph is available when the whole object is parsed), a topological analysis is performed on the precedence graph to get a linearized list. According to the linearized list, the priority decoder can then be generated. FIG. 25 is an example V++ code segment, the induced precedence graph, and the resolution logic that is generated by the V++ compiler.

Linkage

During compilation, logic inside objects are instantiated. There are a few issues that wait until the design is available. For example, one cannot generate the resolution logic in channels until the number of ports that will be hooked up to the channel is determined.

To be more specific, the tasks that are performed by the V++ linker are:

1. Patching reference holes—If an object makes reference to other objects/channels whose definitions are not available at compile time, then the compiler will create reference holes. The linker, on seeing these holes, directs the references to appropriate object/channel instances and creates necessary connections.

2. Finalizing parameters—Parameters are important constructs for reusable, parameterized designs like datapath components. However, it is an obstacle to separate compilation. In V++, parameters are passed via generators. Generators are places where expressions are evaluated to constants and these constants in term can determine the size of logic in an object.

Consider the following two objects:

```
1  object root {
2      bit[3:0] width;
3      barwidth {8} bi;
4  }
5  object bar {
6      bit[3:0] w;
7      generate(bit[3:0] width) {
8          self.w = width;
9      }
10     bit[w--1:0] var;
11 }
```

In object root, bar is instantiated with parameter w bound to 8. This is done by binding the formal argument (width) of the generator of bar with 8 ({8} at line 3). width is then assigned to variable w in bar (line 8). Therefore, instance bi has a variable var which is an eight-bit vector. Note that without compiling object foo, one cannot determine value of w (and the width of var) in object bar.

One of the responsibilities of a V++ linker is to build the instantiation hierarchy and propagate parameters, in a top-down fashion, along the hierarchy. In a sense, the linker needs to do all the compilation if all the non-root objects have parameters that depend on their parents. One way to (partially) get around the problem and to make the compiler to do as much as possible (hopefully, most of the compilation work can be reused) is to compile the object with some default parameter(s) and record the parameter values and the corresponding compiled objects. In the above example, we can declare parameter w with bit [3:0] w default 4 so that w gets default value 4. A master copy of the object definition has to be carried around so that if a new instance of the object needs to be created with parameters that are different from the recorded ones, then the master is compiled with the new parameters (by the linker) and the new pair (parameter values+compiled object) will be recorded.

3. Synthesizing channels/Wiring objects and channels— The main difference between the V++ linker and the programming language linker is that the V++ linker is also responsible for target code (logic) generation.

In programming languages, when one routine calls another routine, the calling routine is sometimes referred to as the caller and the called routines is referred to as the callee. For programming languages, the compiler can generate the code in the caller routine for argument preparation (the code that pushes arguments onto the stack), the "prologue" (the part of a callee routine that prepares the stack for local access), and the "epilogue" (the part of a callee routine that restores stack for the caller) of the callee routine at compile time, without knowing what the caller and the callee are. All that a compiler needs to know is the position and type of each argument.

For V++, even though all senders and receivers follow the same protocol in interfacing with channels, the compiler cannot generate channels before the whole design is hooked up. This is due to the fact that the compiler needs to know the number of ports that are hooked up to a channel in order to generate the arbitration logic in the channel.

Channel Synthesis

Basically, there are two ways objects can communicate with each other—ports and public variables. That is, an object can expose a subset of its variables so that the containing object can sample the values of these variables. An object can also send data to another object via port invocations. For each port, a channel is synthesized to collect/deliver the data to be sent to the port. In addition, the channel is also responsible for resolving multiple data sending requests and decoupling the sender from the receiver. Ports and channels communicate with each other via a set of standard interface signals. Between the sender port and the channel, two control signals, request and ack are used so that:

1. the sender can request for message send by asserting request,
2. the channel can tell the sender if the message has been latch by asserting ack signal.

Between the receiver port and the channel, valid and consume are provided so that:

1. the channel can tell the receiver that there is a valid message for it by asserting valid signal,
2. the receiver can signal the channel that the message has been consumed by asserting consume.

In addition to the above control signals, the port/channel interfaces also provide necessary data wires so that arguments of message send can be latched/delivered by the channel.

As an example, assume that port foo is trying invoke port bar. Assume that the channel cannot sample the data from foo because either another higher priority port is also trying to invoke bar at the same time or the buffer in the channel is full. In this case, the channel has to inform foo that the data cannot be sampled by deasserting an ack signal. If foo is doing a safe port invocation, then the deasserted ack will make foo to lock the data to be passed in the shadow registers,
make foo to keep requesting for port invocation (bar), with the arguments coming from the shadow registers,
prevent foo from "making progress" (or do further computation).

The logic that is synthesized by the V++ linker for a channel is shown in FIG. 26. The circuit shown in FIG. 26 is a linker-generated channel which is connected to a sequential receiving port/process. It takes n port invocation requests (req1, req2, . . . reqn), resolves them, and signals them if the data (<snd-arg1>*, . . . , <snd-argn>*) have been successfully sampled by driving (ack1, . . . , ackn). It informs the receiver that <rcv-arg>* is a valid datum by asserting valid, and the receiver tells that the data have been digested by setting consume. In the synthesized channel logic, Y1 is a de-multiplexer which, controlled by req1, . . . , reqn, connect its input (reqALL) to one of its outputs while keeping the others grounded. Y2 is a multiplexer which, controlled by req1, . . . , reqn, selects one of its inputs (<snd-arg1>*, . . . , <snd-argn>*) and glues it to the output. The circuit in the dashed rectangle is an addressable FIFO with data input data and data output Qdata (which is derived from the rightmost FIFO cell). When enable is asserted, data is loaded into the location addressed by addr. When shift is asserted, the contents of the FIFO are shifted to the right by one cell. The content of the rightmost cell is dropped and the content of the leftmost cell will be zero (unless data is loaded into this cell at the same time). Q_LEN denotes the size (number of cells) of the FIFO. This number can be set by designers. PTR is an address pointer which keeps track of the location of the first empty slot in the channel's FIFO.

FIG. 26 also illustrates a linker-generated channel which is connected to a combinational receiving port. Note that the FIFO (as well as the circuit for maintaining the FIFO pointer) in the circuit is removed as combinational port invocations take zero time. In addition, the ack and consume signals are removed. This is because one cannot do safe port invocation to a combinational port.

Figure 27:
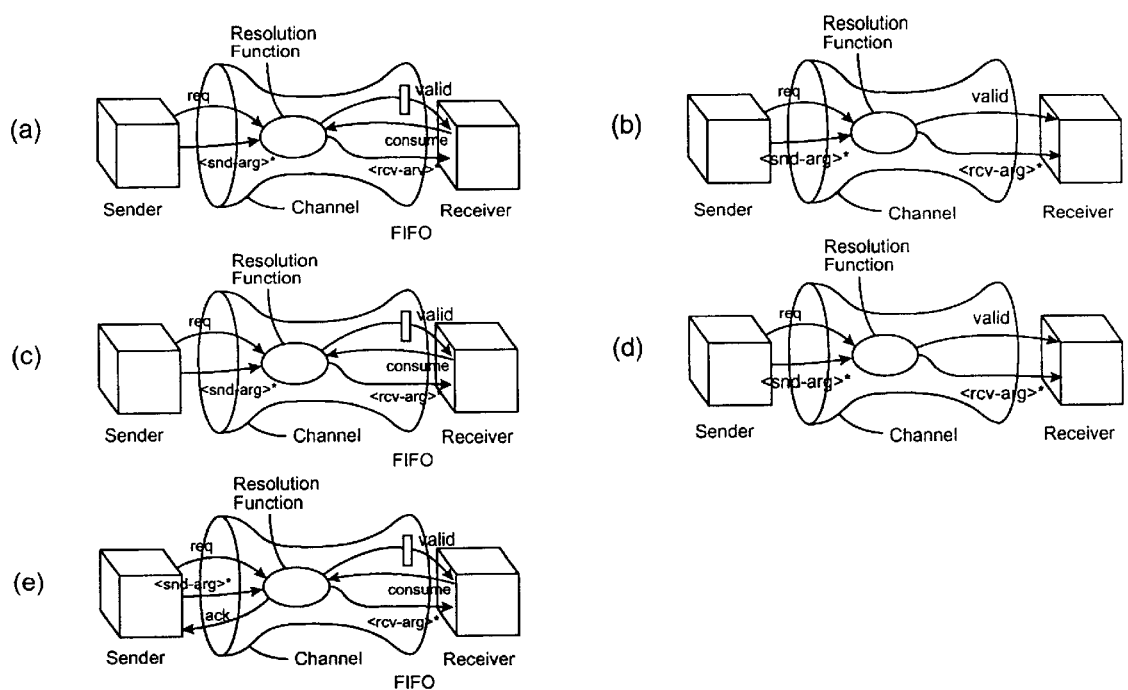
FIG. 27 is a diagram illustrating connecting channels and ports.

FIG. 27 illustrates how the linker-generated channels are hooked up with various combinations of sender and receiver ports. FIG. 27 shows a sequential port invoking another sequential port. In FIG. 27, a sequential port sends messages to a combinational port and in FIG. 27, a combinational port sends messages to a sequential port. In FIG. 27, messages are sent from a combinational port to another combinational port. FIG. 27 shows the interconnection for a safe port invocation.

The resolution functions in FIG. 27 is the same as the circuit shown in FIG. 26. The resolution functions in FIG. 27 are the same as the combinational circuit in FIG. 26.

Optimization

Figure 28:
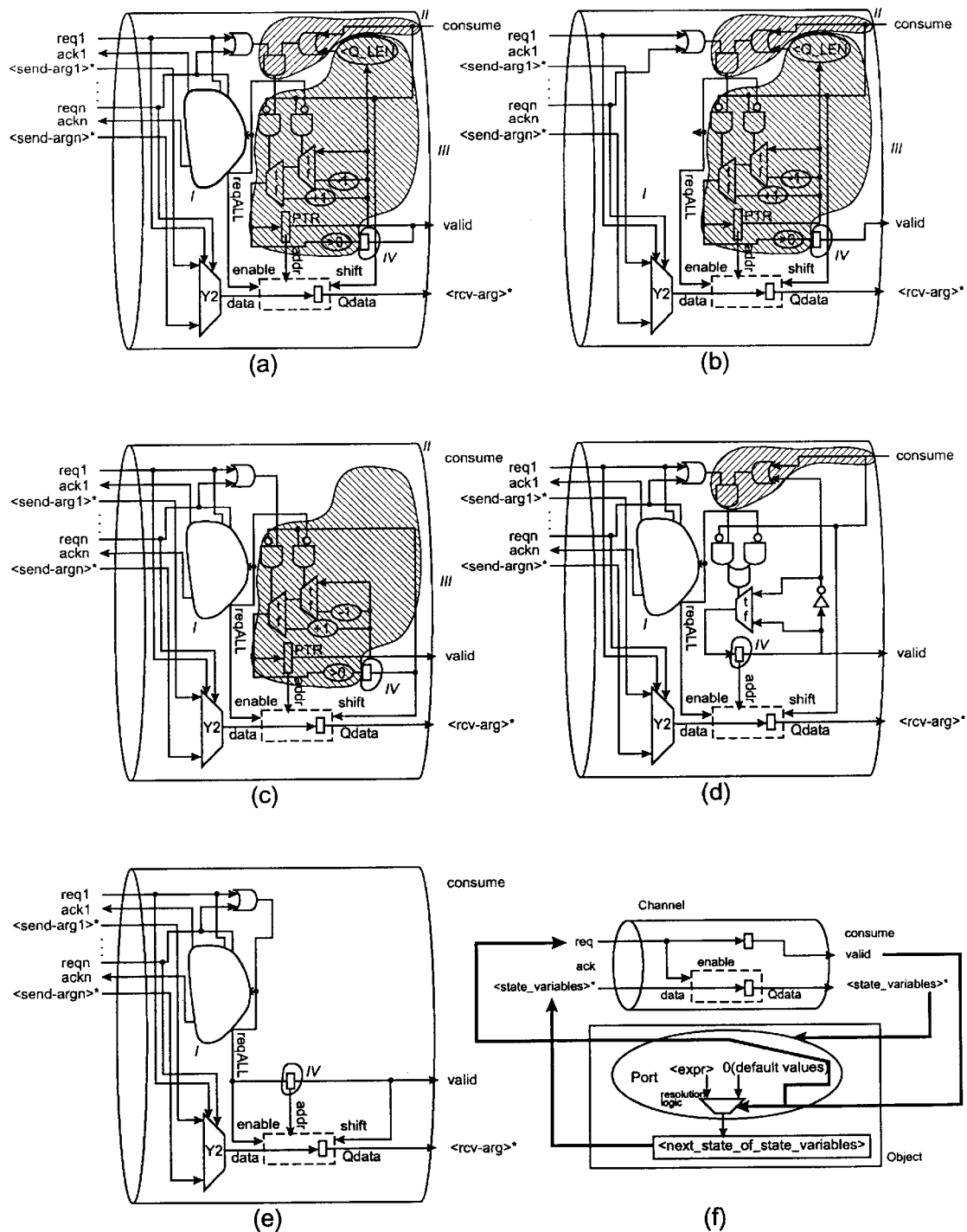
FIG. 28 is a diagram illustrating the optimization of channel circuitry.

The previous sections deal with the generation of logic in the general settings. In this section, we discuss the optimization of generated circuits for V++ programs. Consider the channel circuits generated by the V++ compiler as shown in FIG. 28. Under certain circumstances, the generated circuits can be optimized:

1. Assume that the invocations to a port are all default (non-safe). In this case, there is no need for generating ack signals. Therefore, the circuit labeled I in FIG. 28a can be removed. The result is shown in FIG. 28b.
2. If the receiver does not suspend (that is, it does not do safe send, therefore, consume will always be asserted when there is a valid signal), then the channel does not need to query the consume signal. That is, the circuitry labeled II in FIG. 28a can be discarded. The reason is that the circuitry is used to block the request signal coming from the sending ports when the FIFO is full and the receiving port is suspended. However, as the receiving port cannot be suspended (by assumption), this circuitry is not necessary. The result is shown in FIG. 28c.
3. Assume that the size of the FIFO queue is one, then the circuit labeled III in FIG. 28 can be simplified. FIG. 28d shows the resulting circuit. Note that, in this case, the PTR register is identical to the valid latch (labeled with IV). Therefore, it is removed. In addition, as the valid register is only one bit, the adder, the subtracter, and the comparator are simplified.
4. If both conditions 2 and 3 are true, then the FIFO pointer calculation circuitry can be removed as shown in FIG. 28e.

One of the most often used coding styles of specifying FSMs in V++ is:

```
fsm (<state_variables>*) @(clk) {
    <next_states_of_state_variables> = <expr>;
    fsm (<next_states_of_state_variables>*);
}
```

After applying the above rules, we can optimize the circuit as shown in FIG. 28f. Note that the next state of valid latch is simply itself. Therefore, valid can be replaced by a constant (0 if fsm is not invoked in the constructor, 1 if fsm is invoked in the constructor of the containing object). In this case, the "redundant logic" created by the V++ compiler/linker is the resolution function (which is a mux with its control glued to constant valid).

Simulation

In the previous sections, we address the compilation, linking, and logic generation (synthesis/optimization) of V++ programs. In this section we show how a V++ design can be simulated. There are several ways to simulate a V++. For example, once the logic of the whole design is generated, one can use the techniques in to flatten and simulate the whole circuit. For large circuits, these global compilation technique can be prohibitively time-consuming.

On the other hand, one can take advantage the structured communication in V++ to decompose the whole simulation task into several smaller sub-tasks. Excluding the public wire communication, the only way an object can communicate with another is via port invocation. In addition, all ports invocation are realized by channels. Note that for sequential port invocations (where the receiver is a sequential port), the channel uses latches to hold signal values for the receiver and it introduces at least one (or more) cycle of delay. These latches ensure that there is no combinational path from the logic of one port to the logic of another port. Therefore, the sender and the receiver ports can be scheduled for evaluation in any order (if they belong to different objects).

Public wires (which can be visible only to the parent of an object in the instantiation hierarchy) restrict the possible schedules. As combinational signals are allowed to propagate uni-directionally (upward along the instantiation hierarchy), the logic in children should be evaluated before their parents. FIG. 29 shows one possible hierarchical simulator for a V++ design. Currently, the V++ compiler/linker can be instructed to generate Java programs (as the simulation code for V++ programs) with the structure shown in FIG. 29.

The simulator works as follows. For each hardware cycle, the simulator first evaluates the combinational circuits in channels so that the values of the latch walls in channels can propagate towards channel outputs. The logic in objects are then evaluated and the latches in objects are updated. It is assumed (and enforced by current V++ compiler) that no latches in objects can directly drive inputs to channels. If they do, buffers will be inserted. This way, channels will not see the next states of the latches in objects. Before the end of the current hardware cycle, the logic of channels are evaluated again and the latches of channels are updated. Note that we need to evaluate the logic in channels one more time in order to propagate the inputs to channels to the latches in channels.

Experimental Results and Conclusions

The algorithms presented in the previous chapters have been implemented. In this chapter, we put V++ into action. We apply the V++ design language to a real design—the InfoPad.

The InfoPad Project

The InfoPad project is a low power wireless multimedia communication device. InfoPad is not a computer. It is a hand-held, battery operated communication terminal like a multimedia cellular phone. It communicates with a net of closely spaced base stations to provide wireless communication with the backbone networks. InfoPad has a graphical display and a pen/keyboard input. It also supports bi-directional audio and full color video. However, it does not perform general purpose computing, storage, and communication, which are done by the servers on the network.

Figure 30:
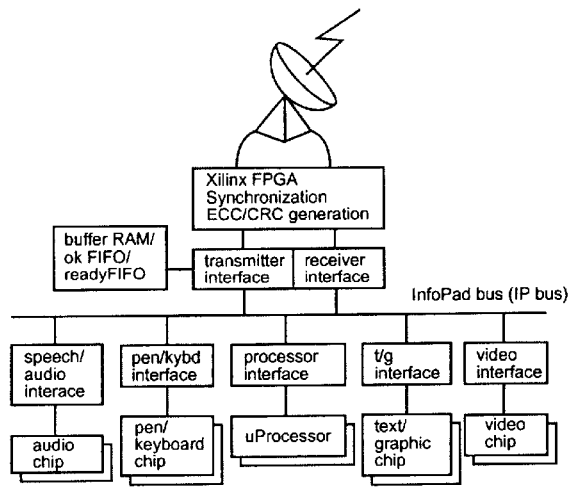
FIG. 30 is a block diagram illustrating an InfoPad architecture.

The architecture of a pad is shown in FIG. 30. A low voltage bus (IP bus) serves as the backbone. It connects several logical chips. The chips talk to the IP bus via common bus interface modules to ensure interoperability. A chip that can serve as a data source (sink) is-also called a master (slave). When a master has data to send it requests the bus. At least one bus cycle later, after the access request is granted, the master can put data on the bus.

For example, when a user taps the pen on the screen, five bytes (a pen event packet have to be sent from the pen device (master) to the transmitter chip (slave) to reflect the pen movement. After receiving the packet, the transmitter put the packet in a packet buffer, the packet number in a ready FIFO. The transmitter talks to the microprocessor to schedule the packet for transmitting over the wireless modem. The communication between the transmitter chip and the microprocessor can be done by either interrupts or polling. The transmitter chip uses a static RAM as buffers for packets coming from different chips. One of the major functionalities of the transmitter chip is to manage the buffer RAM for up to five streams (each stream is basically a logical device which can send packets to the transmitter). Once the processor detects that a packet is ready to send, it schedules the packet for transmitting by putting the packet number on an ok FIFO in the transmitter. The transmitter constantly monitors the ok FIFO for any packet that is available to be sent over the radio. The servers on the network can then compute the response based on the received pen events. If the response involves updating the pixels on the pad, the server will send packets to the pad. On the pad, when the receiver chip (master) gets bytes from the wireless modem, it redirects them to the appropriate destination (text/graphic chip) based on the type field of the packet. Basically, one can imagine the receiver chip as a byte interpreter. It analyzes the packet header to find out the target chip for the packet body and then forwards the data bytes to the destination without touching them.

All these data streams are sent over the bus using a common data-grain consisting of a start-of-packet byte (SOP), the data bytes, and the end-of-packet (EOP) byte. Each stream is associated with a unique address pair in the address space on the IP bus. The high address is the signaling register which is used to indicate the start and end of packet. The low address is used to send data (packet body).

Above the transmitter/receiver interface is the XILINX chip which computes error correction code (ECC) and cyclic redundancy check code (CRC) for packet header/data. The chip is also responsible for synchronizing itself and the incoming bit-stream/packet from the receiving modem.

Implementing InfoPad Using V++

We use V++ to implement four versions of "InfoPad." We implement the major functionalities of the backbone communication structures on a pad with various V++ coding styles and subsets of V++ constructs. In this experiment, we implement the circuits that are necessary to carry out the main functionality of InfoPad. For example, we make sure that the pen packets will be buffered and finally transmitted over the radio. We also make sure that whenever the receiver chip gets packets for the text/video device, it will finally get displayed on the screen. There are parts of the design that are not implemented. For example the part of the circuits that is programmed at initialization time is hard-wired. In addition, some parts are scaled down (and abstracted). For instance, the buffer RAM is shrunk to a 4-byte (32-bit) memory instead of a 64k-byte RAM. The pointers that address the RAM for buffer management are also scaled down. Since the devices of that are hooked up with the IP bus are operating at different speeds, they are only modeled by nondeterministic packet generators/consumers. This is due to the fact that currently V++ allows only one clock domain.

Reusing Chips in Different Implementations

To find out the overhead involved when compiler generated channels are generated for communication, in the following implementations of InfoPad, the V++ code for the chips/devices (pen/keyboard, text/graphic, tx/rx, and microprocessor) are reused. However, the interface they use to communicate with each other are slightly modified in order to accommodate various design styles.

The transmitter device is modeled by a packet sink and the receiver device is modeled by a nondeterministic packet generator. In the experiment, the receiver is programmed to generated packets targeted only for the text/graphic chip.

The pen/keyboard device is modeled as a nondeterministic keystroke generator. A packet is generated for each keystroke by wrapping the keystroke data with an appropriate header/tail. This job is accomplished by a "packetizer" FSM. After a packet is formed, the pen/keyboard interface requests bus access. For example, if the pen/keyboard device needs to send a pent event packet (5 bytes) to the transmitter, it first writes an SOP (start-of-packet) to a specific address on the IP bus that is reserved for the pen/keyboard. It then writes the bytes of the packet body in the following few bus cycles (the IP bus can accommodate one byte per bus cycle). At last, the pen/keyboard device writes an EOP (end-of-packet) to the transmitter interface. Bytes of packets from different masters on the bus can be arbitrarily interleaved. But the order among bytes in the same packet should be maintained by the masters. The transmitter interface tells the beginning/end of packets by being written at the addresses that are reserved for signaling (SOP/EOP). The transmitter interface tells the source of the data bytes of packets by decoding the address that are being written (remember that for each monaster, a pair of addresses is reserved, one for signaling and the other for the packet body/data). This way, the transmitter can handle multiple streams of bytes from multiple devices. That is, at any point in time, the transmitter might have partially formed packets from different packet sources.

The microprocessor (an ARM processor) is modeled by a scheduler FSM with nondeterministic delay. The microprocessor can issue bus requests and it can receive service requests (interrupts). The processor serves the interrupt by reading the ready FIFO in the transmitter interface and then writes the packet number back into the ok FIFO of the transmitter interface once the packet is scheduled to be transmitted.

The text/graphic device is simply a data sink.

The major difference among the various implementations is the way data are delivered. In implementation I, a user designed channel is used to implement the IP Bus that is used in the InfoPad project. In implementation II, III, and IV, variations of V++ built-in channels are used to deliver data. In addition, due to the delays introduced by V++ built-in channels, extra buffer entries are allocated in implementation II, III, and IV. These extra FIFO entries are used to prevent bytes from getting lost when FIFO's are full. Details of the modifications to the sizes of FIFO buffers are provided below.

In the first implementation, we redo the InfoPad backbone in V++ (IP bus plus the interface chips) and try to match the original design in a gate-to-gate fashion. For this design, we restrict ourselves to use only the "level-0" V++, which is essentially SMV. Basically, level-0 V++ provides data operators (gates), assignments (naming of wires), conditional statements (multiplexors), instantiations. General port invocations are not allowed. The only allowed forms of port invocations are:

A port can invoke itself via tail recursion—this kind of port invocation is only used to design finite state machines. Such a form of port invocation can be handled by the optimization techniques described above.

Sending messages to user defined channels—the V++ compiler does not generate logic in this case. All that a compiler does is to generate and wire request, acknowledgment, valid, and consume signals to the user defined channel.

With these level-0 V++ constructs, one can describe gates, wires, and connections. We refrain from using the "advanced constructs" such as safe sends.

If an interface cannot lock the bus when it has data to send (the acknowledgment signal does not come back in time), it will keep requesting the bus with the same data. This is essentially what a safe send tries to do. The only difference is that the logic has to be crafted by hand in this implementation.

Figure 31:
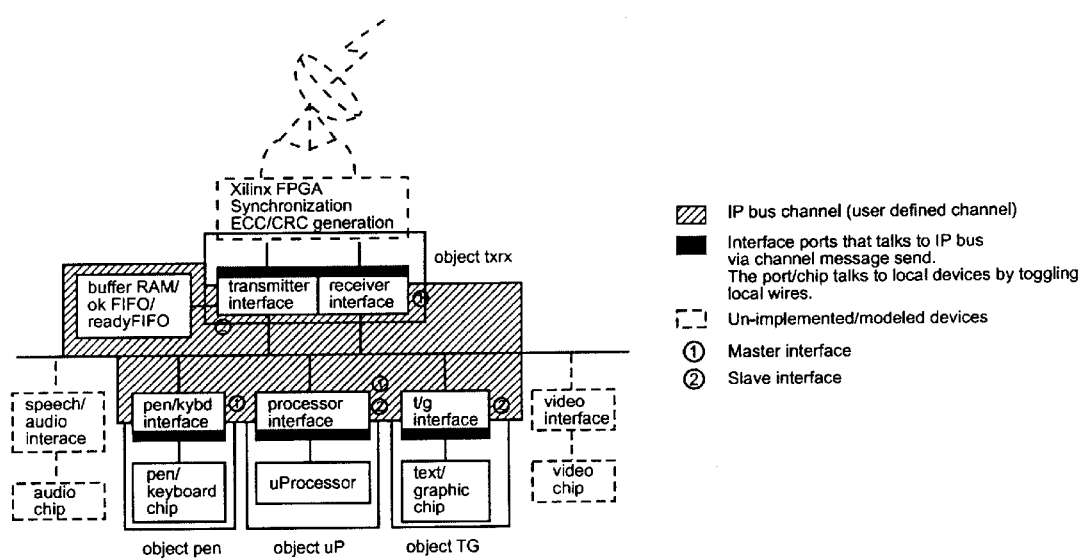
FIG. 31 illustrates a first implementation of InfoPad.

The architecture is shown in FIG. 31. The user defined channel arbitrates the incoming requests from master interfaces and determines which interface may put its data on the bus. The user defined channel (the light gray rectangle) is used to implement the IP bus and the bus interfaces. The white rectangles in the user defined channel are the parts of interfaces that are put in the user defined channel code. The dark gray rectangles that are connected to these white rectangles are the parts of interfaces that sit in each individual object. They are basically channel invocations which glue wires that are local to each object to wires in the channel. The port/channel boundaries are drawn in such a way that there is no combinational path from one port (device) to another.

We implement/model the devices/interfaces depicted in solid lines. These are: the pen/keyboard chip, the microprocessor, the text/graphic chip, a small fraction of the FPGA (that is responsible for communicating the tx/rx interface), the pen/kbd interface, the processor interface, the t/g interface, and the transmitter/receiver interface (and their buffer RAM). The devices that are drawn in dashed lines are not modeled or implemented.

As mentioned above, the pen/keyboard interface is divided into two pieces, one (the white rectangle) resides in the user defined channel and the other (the dark gray rectangle) resides in the pen object. The dark gray rectangle is a V++ channel invocation which directly wires control/data signals in the user defined channel to signals in the pen object. The white rectangle participates in the arbitration concerning which interface gets access. It also has multiplexors, controlled by the output of the arbitration logic, to gate data/address to the IP bus.

The text/graphic interface simply routes the data on the IP bus to the text/graphic device. The address on the IP bus is decoded by the interface so that the text/graphic device knows if it is the intended receiver of the data on the bus.

The microprocessor interface routes the interrupt line to the microprocessor and contends for bus access whenever the microprocessor tries to use the IP bus. The microprocessor has the highest priority among all the masters.

The receiver interface is divided into two pieces. One of them (the dark gray rectangle) sits in the txrx (transmitter/receiver) object and the other (the white rectangle) sits in the user defined channel. The dark gray rectangle is simply a channel invocation. The white rectangle can be partitioned into the receiver logic and the transmitter logic. The receiver logic is a byte interpreter which redirects the packet body data to the appropriate destination device according to the type of the packet. The transmitter logic is basically a packet buffer manager which collects packet bytes in the buffer RAM until packets are complete. As indicated above, the transmitter logic can handle multiple data sources. For each of these data sources, a region in the buffer RAM is reserved. Basically, each region is organized as a ring of buffers. When the transmitter receives a byte, it tells where the byte comes from by decoding the address that is being written. The transmitter then put the byte in the appropriate buffer ring. When the transmitter receives an EOP, it knows that the packet is complete. It sends interrupts to the microprocessor when there is a packet formed and ready to be sent. The processor then chooses which packet is allowed to be transmitted by writing the packet number into the ok FIFO. When the ok FIFO is not empty, the transmitter interface presents the packets to the XILINX chip so that the an appropriate error correction code can be generated and the packet can be delivered through the wireless modem. The buffer manager is the most complicated logic of all the interfaces. In implementation II, III, and IV, the buffer manager (as well as the buffer RAM) as well as the byte interpreter of the receiver interface are put in the txrx object.

Another Implementation

Figure 32:
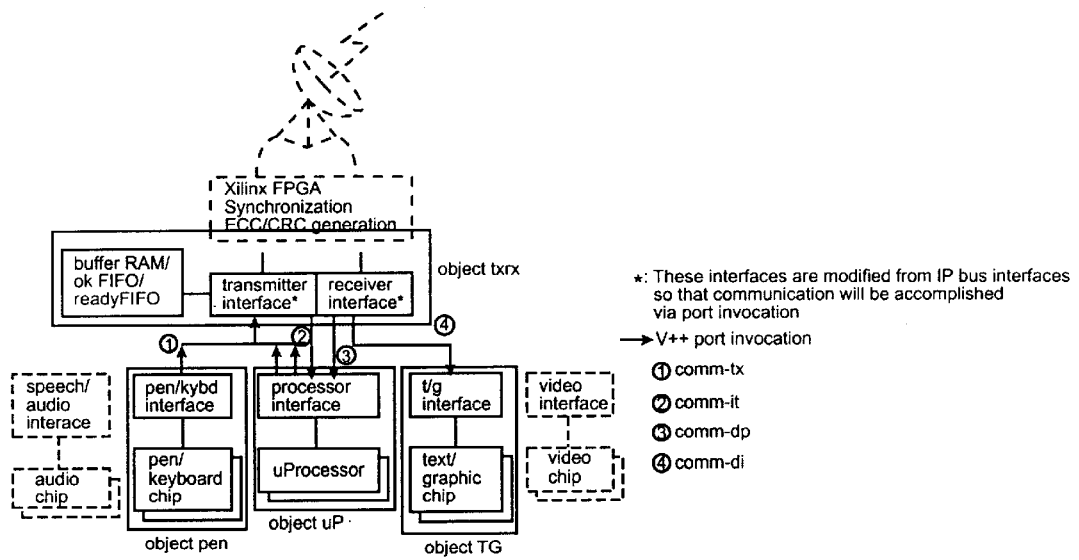
FIG. 32 illustrates a second implementation of InfoPad.

In this experiment, we take advantage of the built-in V++ message delivery mechanism to do the communication. The master devices sends data to the slaves by safe port invocations. The pen object sends bytes of keystroke packets directly to the tx port (transmitter) of the txrx (transmitter/receiver) object. The microprocessor object can either request to write into tx's control registers or to read the control registers. When the processor requests to read data from the tx port, it will first send the read request to the port. At least a cycle later, when the tx has the data ready, it calls back the microprocessor with the data the processor requested. Note that interrupts are also delivered by safe port invocations. In this implementation, when the receiver interface has a packet for the text/graphic chip, it is delivered a by safe port invocation. FIG. 32 shows the architecture of implementation II.

Note the difference in bus timing between implementation I (FIG. 31) and implementation II (FIG. 32). With the IP bus, if a read/write operation can go through without being blocked, it takes two bus cycles to accomplish the transaction. With the V++ built-in channels, it takes one cycle for the processor to send a read request to the transmitter and another cycle for the transmitter to call the processor back with the data requested. Therefore, the requested data is visible to the processor at the beginning of the third bus cycle after the data request is generated (which is the first cycle).

Similarly, timing of interrupts are also changed as they are delivered by V++ built-in channels. Due to the delay introduced by channels, the buffering mechanism implemented on the transmitter device needs to be modified. Consider the following scenario. If the transmitter collects a complete packet at cycle i, it will put the packet number in the ready FIFO indicating that a packet is ready to be sent. It will also interrupt the microprocessor regarding the availability of the new packet in the mean time. Assume that the ready FIFO gets full at cycle i. With the original IP bus implementation, the microprocessor responds to the interrupt at cycle i+1, i.e., at the i+1-th cycle, the processor will take over the IP bus and block other devices from accessing the bus. If the microprocessor fails to lock the bus at the i+1-th cycle (this is possible for implementation II), then in case there is a new packet formed (e.g., the pen/keyboard chip sends a EOP (end-of-packet) to the transmitter chip) at that cycle, the newly formed packet can potentially get dropped. In another word, by locking the bus at the i+1-th cycle, it is assured that no new packet will be formed at the i+1-th cycle and no packet will get dropped from the full FIFO.

One way to get around this problem is to enlarge the FIFO so that it alerts the processor before it is full. This modification is made to implementations II, III, and IV to ensure that no packets are dropped.

A Third Implementation

Similar to implementation II, in this design we use V++'s built-in channels to do all the inter-device communication. Unlike implementation II, all communication destined at the same target device is implemented via invocation of the same port. FIG. 4.5 illustrates the architecture of implementation III.

Figure 33:
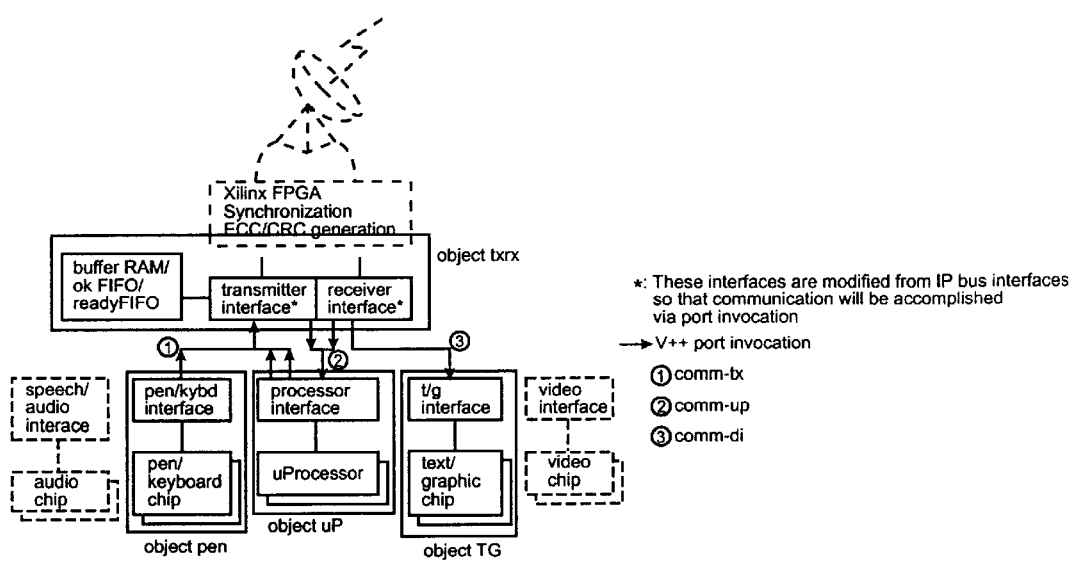
FIG. 33 illustrates a third implementation of InfoPad.

Contrast FIGS. 32 and 33. Basically, each object is now equipped with only one port for all the service(s) it provides. For example, the processor object provides one port through which it can be interrupted or called. The txrx object also provides only one port which serves all read/write requests for the object.

Using this coding style, the intent is to illustrate the use of the built-in V++ channels as "easy-to-use" buses that are generated by the V++ compiler on the fly. We want to understand what is the trade-off for using "compiler-generated buses" instead of the hand-crafted buses.

A Fourth Implementation

Figures 34, 35:
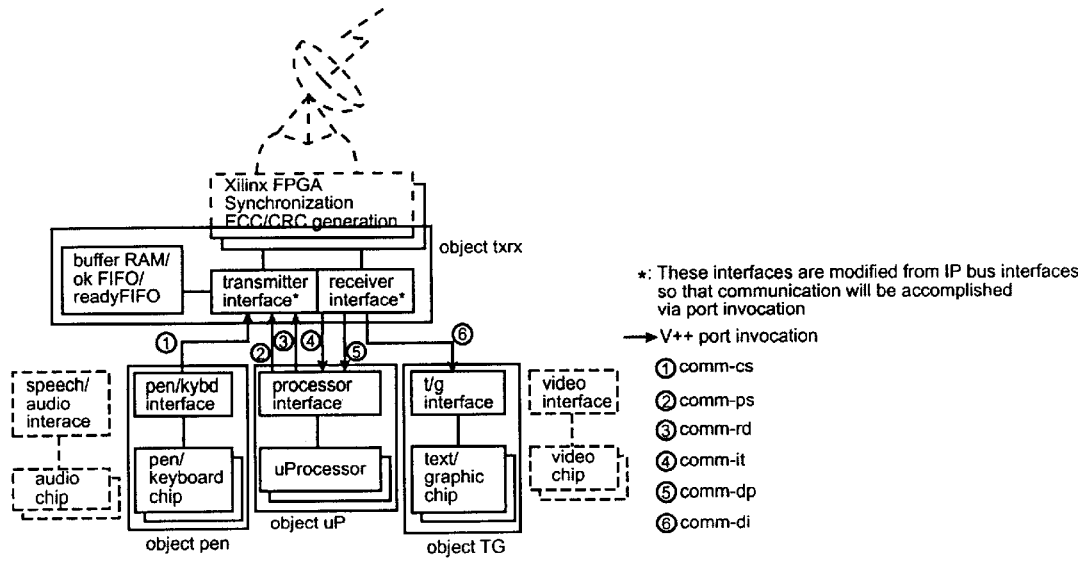
FIG. 34 illustrates a fourth implementation of InfoPad.
FIG. 35 compares the implementations of FIGS. 31 to 34.

Similar to implementation II, in the design of FIG. 34 we use V++ built-in channels to do all the inter-device communication; for each service provided by a device, a separate port is provided. This implementation is used as a contrast to implementation II (where all services provided by an object are accessed via a single port). For example, the transmitter allows the pen device to write into its signal/data registers to send pen packets. The transmitter also allows the microprocessor to read/write into its internal latches to program the control registers. In implementation IV, these services are provided through distinct ports. In implementation II, both services are provided by a single port and are resolved by the compiler generated channel when both parties request services at the same time.

Results

We implemented the four variations of InfoPad in V++ and compiled the designs into SMV. The SMV files are then translated into blif files via several intermediate format compilers. The generated blif files are then simulated in VIS. We also mapped the blif files to various technology libraries.

The experimental results are summarized in FIG. 35. There is one column for each variation of InfoPad. The rows are the size of the V++ source code (number of lines/number of bytes), the size of the SMV file generated by the V++ compiler (number of lines/number of bytes), the size of the blif files by flattening the SMV files, the area of the implementation when it is mapped to a circuit with cost functions that minimize delay using the MCNC technology library (mcnc.genlib+mcnc_latch.genlib), the area of the implementation when it is mapped to a circuit with cost functions that minimize area using the MCNC technology library, the area of the implementation when it is mapped to a circuit with cost functions that minimize delay using a standard cell technology library (stdcell2_2.genlib), the area of the implementation when it is mapped to a circuit with cost functions that minimize area using a standard cell technology library, the latch count, the literal count, and the time (approximate) we spent on doing each design.

Note that the circuits are mapped without any logic optimization. The reason of omitting the logic optimization is that, these implementations contain circuitry that are part of InfoPad but not used in the experiment. For example, there are control registers that can be programmed at initialization time by the microprocessor. However, in the experiment, the functionalities of the implementations that are controlled by these control registers are hard-wired. Nonetheless, the initialization circuitry and the circuitry used to access these control registers are still implemented in order to make the implementations as close to InfoPad as possible.

Note that when built-in V++ channels are used (implementation II–IV) for communication devices, the size of the sources is about thirty percent smaller than the design that uses user defined channels (implementation I). This is because in implementation I, the designer has to specify all arbitration/resolution logic in the channel. The latch count shows that there is about a twenty percent increase in the number of latches when V++ built-in channels are used. We found that most of the extra latches come from the shadow registers used in safe sends. At first, it seems that implementations II–IV spend too much area overhead on compiler-generated circuits. However, after the whole implementations are mapped into circuits with various technology libraries and cost functions, we realize that the actual area overhead is quite small. For example, if we map the implementation onto MCNC technology library, the overhead is between 0.5 to 4.6 percent.

The main advantage of using V++ built-in communication mechanism seems to be the short design cycle. This is consistent with the sizes of various implementation. Basically, the larger the source code one needs to write, the longer it takes.

We also found that during the design process, using V++ built-in channels helps relieve ourselves from worrying about the bus timing. For example, assume that one object (e.g., a master) has some data to be delivered to another object (e.g., slave). The master has to keep requesting for bus access until it is granted. After the master is granted for bus access, it places the data on the bus. In addition, the master should make sure that when it puts data on the bus, the slave is able to pick up the data. For InfoPad, the slaves are always available once the master gets the bus. In general, when a design involves bus like structure, the correctness of a transaction depends on the relative timing of the devices involved in the transaction. For example, when a master has a piece of data to be sent to a slave, the master should explicitly check if the slave is able to receive the data (if the bus is owned by another higher priority master, or if the slave is busy and not listening to the bus, then the slave cannot receive the data) in order to prevent the data from getting lost. Using V++ 's safe send, one simply do safe port invocation and the compiler does the rest. The compiler generated circuitry not only does handshaking between the master and the slave, it also buffers inputs to the slave in case the slave is busy.

Conclusions

From the experiment results shown in the previous section, V++ introduces little resource overhead. In addition, the shorter design cycle and smaller source sizes can benefit large designs, improve maintainability, and provide correct designs more quickly.

On the other hand, V++ imposes the following constraints:

1. In V++, all inter-object communication has to be accomplished via channels that induce at least one cycle of delay. This could impact the implementation of the design. For example, an interrupt will take at least one channel cycle to propagate. Therefore, if the interrupt is used to inform the processor that a buffer is full, then extra entries should be allocated in the buffer in order to compensate the extra delay used to propagate the interrupt.

2. In V++, a built-in channel can deliver only one message at a time. Therefore, if a compiler generated channel is used to implement the bus, then the potential "multi-tasking" that can take place on the bus (e.g., one device is generating an interrupt while the other device is sending data around) has to be modeled by multiple bus transactions. Therefore performance can be degraded.

3. In V++, all arguments of a port invocation are uni-directional. In case bi-directional variables are desired, they need to be split into input only and output only variables.

4. Currently, there can be only one clock domain in a V++ design. The only way to "model" the peripheral modules running at different clock rates is via nondeterminism. For instance, in the InfoPad example, we use nondeterministic event generators/consumers to model pen and text/graphic devices.

The preceding has been a description of the preferred embodiment of the invention. It will be appreciated that deviations and modifications can be made without departing from the scope of the invention, which is defined by the appended claims.

What is claimed is:

1. A method of designing an electronic circuit comprising:

representing a first portion of the circuit as a first object, the first object corresponding to a first set of variables and a first set of ports, the first set of variables defining possible states of the first portion of the circuit; the first set of ports defining an external view of the first portion of the object;

representing a second portion of the circuit as a second object, the second object corresponding to a second set of variables and a second set of ports, the second set of variables defining possible states of the second portion of the circuit; the second set of ports defining an external view of the second portion of the object;

representing information about interactions of the state of the first portion of the circuit to the second portion of the circuit by the sending of a first message from a first one of the first set of ports to a first one of the second set of ports, wherein delivery of the first message to the first one of the second set of ports is repeatedly requested until the second portion of the circuit stores the first message; and representing information about interactions of the state of the second portion of the circuit to the first portion of the circuit by the sending of a second message from a second one of the second set of ports to a second one of the first set of ports, wherein delivery of the second message to the second one of the first set of ports is repeatedly requested until the first portion of the circuit stores the second message.

2. A method as in claim 1 wherein the first message is stored in a latch that keeps requesting delivery of the first message to the first one of the second set of ports until the second portion of the circuit stores the first message.

3. The method of claim 2 wherein the second message is stored in a register that keeps requesting delivery of the second message to the second one of the first set of ports until the first portion of the circuit stores the second message.

4. A method as in claim 1 wherein the step of sending the first message further comprises representing the first one of the second set of ports as an arbitered first-in first-out buffer.

5. A method as in claim 1 further comprising a third set of ports which can only be accessed by the first object with which the third set of ports are associated.

6. A method as in claim 1 wherein the first and second messages are in a two-wire protocol format of request-acknowledge.

7. The method of claim 1 wherein the steps of sending the first and second messages further comprise sending the first and second messages between the first and second sets of ports via channels which deliver the messages to recipient ports.

8. The method of claim 1 wherein the first one of the first set of ports stops consuming incoming messages until the first message is received at the first one of the second set of ports.

9. The method of claim 8 wherein the second one of the second set of ports stops consuming incoming messages until the second message is received at the second one of the first set of ports.

10. The method of claim 1 wherein a message with a highest priority is delivered to the first one of the first set of ports when two or more messages are sent to the first one of the first set of ports at the same.

11. A method of designing an electronic circuit comprising:
   representing a first portion of the circuit as a first object, the first object corresponding to a first set of variables and a first set of ports, the first set of variables defining possible states of the first portion of the circuit; the first set of ports defining an external view of the first portion of the object;
   representing a second portion of the circuit as a second object, the second object corresponding to a second set of variables and a second set of ports, the second set of variables defining possible states of the second portion of the circuit; the second set of ports defining an external view of the second portion of the object;
   representing information about interactions of the state of the first portion of the circuit to the second portion of the circuit by delivering a first message from a first one of the first set of ports to a first one of the second set of ports, wherein the first one of the second set of ports can receive no more than one message in each clock cycle; and
   representing information about interactions of the state of the second portion of the circuit to the first portion of the circuit by delivering a second message from a second one of the second set of ports to a second one of the first set of ports, wherein the second one of the first set of ports can receive no more than one message in each clock cycle.

12. The method of claim 11 wherein the first message is delivered to the first one of the second set of ports via a first channel.

13. The method of claim 12 wherein the first channel queues the first message in a first-in first-out buffer.

14. The method of claim 12 wherein the first channel stores the first message.

15. The method of claim 11 further comprising:
   delivering a third message from the first one of the first set of ports to the first one of the first set of ports, wherein the first one of the first set of ports can receive no more than one message in each clock cycle.

16. A method of designing an electronic circuit comprising:
   representing a first portion of the circuit as a first object, the first object corresponding to a first set of variables and a first set of ports, the first set of variables defining possible states of the first portion of the circuit; the first set of ports defining an external view of the first portion of the object;
   representing a second portion of the circuit as a second object, the second object corresponding to a second set of variables and a second set of ports, the second set of variables defining possible states of the second portion of the circuit; the second set of ports defining an external view of the second portion of the object;
   representing information about interactions of the state of the first portion of the circuit to the second portion of the circuit by delivering a first message from a first one of the first set of ports to a first one of the second set of ports, wherein the first one of the first set of ports stops consuming incoming messages until the first message is delivered to the first one of the second set of ports; and
   representing information about interactions of the state of the second portion of the circuit to the first portion of the circuit by delivering a second message from a second one of the second set of ports to a second one of the first set of ports, wherein the second one of the second set of ports stops consuming incoming messages until the second message is delivered to the second one of the first set of ports.

17. The method of claim 16 wherein a flag indicates to the first one of the first set of ports whether the first message has been delivered.

18. The method of claim 17 wherein a flag indicates to the second one of the second set of ports whether the second message has been delivered.

19. A method of designing an electronic circuit comprising:
   representing a first portion of the circuit as a first object, the first object corresponding to a first set of variables and a first set of ports, the first set of variables defining possible states of the first portion of the circuit; the first set of ports defining an external view of the first portion of the object;
   representing a second portion of the circuit as a second object, the second object corresponding to a second set of variables and a second set of ports, the second set of variables defining possible states of the second portion of the circuit; the second set of ports defining an external view of the second portion of the object;
   representing information about interactions of the state of the first portion of the circuit to the second portion of the circuit by the sending of a first message from a first one of the first set of ports to a first one of the second set of ports, wherein the first one of the first set of ports requests permission to send the first message before delivery of the first message to the first one of the second set of ports; and
   representing information about interactions of the state of the second portion of the circuit to the first portion of the circuit by the sending of a second message from a second one of the second set of ports to a second one of the first set of ports, wherein the second one of the second set of ports requests permission to send the second message before delivery of the second message to the second one of the first set of ports.

20. The method of claim 19 wherein a channel sends an acknowledgment signal to the first one of the first set of ports to grant transmission of the first message to the first one of the second set of ports.

21. The method of claim 20 wherein said channel sends an acknowledgment signal to the second one of the second set of ports to grant transmission of the second message to the second one of the first set of ports.

22. The method of claim 19 wherein the first one of the first set of ports does not initiate the delivery of the first message to the first one of the second set of ports if a channel does not grant the delivery of the first message.

23. The method of claim 22 wherein the second one of the second set of ports does not initiate the delivery of the second message to the second one of the first set of ports if said channel does not grant the delivery of the second message.

24. A method of designing an electronic circuit comprising:

representing a first portion of the circuit as a first object, the first object corresponding to a first set of variables and a first set of ports, the first set of variables defining possible states of the first portion of the circuit; the first set of ports defining an external view of the first portion of the object; and passing variable arguments within a first one of the first set of ports, wherein the first one of the first set of ports consumes the arguments only in response to a guard signal which indicates the presence of the variable arguments and the assertion of a clock signal.

25. The method of claim 24 wherein the first one of the first set of ports consumes the arguments when the guard signal is true.

26. The method of claim 24 further comprising:

representing a second portion of the circuit as a second object, the second object corresponding to a second set of variables and a second set of ports, the second set of variables defining possible states of the second portion of the circuit; the second set of ports defining an external view of the second portion of the object; and representing information about interactions of the state of the first portion of the circuit to the second portion of the circuit by delivering a first message from a first one of the first set of ports to a first one of the second set of ports.

* * * * *

UNITED STATES PATENT AND TRADEMARK OFFICE
CERTIFICATE OF CORRECTION

PATENT NO. : 6,421,808 B1
DATED : July 16, 2002
INVENTOR(S) : Patrick C. McGeer et al.

It is certified that error appears in the above-identified patent and that said Letters Patent is hereby corrected as shown below:

<u>Title page,</u>
Item [73], should read as follows: -- Item [73], Assignee: Cadence Design Systems, Inc., San Jose, CA (US) --

Signed and Sealed this

Twenty-sixth Day of November, 2002

Attest:

Attesting Officer

JAMES E. ROGAN
*Director of the United States Patent and Trademark Office*